(12) United States Patent
Taniguchi et al.

(10) Patent No.: US 11,682,720 B2
(45) Date of Patent: Jun. 20, 2023

(54) SWITCHING TRANSISTOR AND SEMICONDUCTOR MODULE TO SUPPRESS SIGNAL DISTORTION

(71) Applicant: SONY SEMICONDUCTOR SOLUTIONS CORPORATION, Kanagawa (JP)

(72) Inventors: Satoshi Taniguchi, Kanagawa (JP); Masashi Yanagita, Kanagawa (JP); Katsuhiko Takeuchi, Kanagawa (JP); Shigeru Kanematsu, Kanagawa (JP); Takanori Higashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 108 days.

(21) Appl. No.: 17/047,453

(22) PCT Filed: Mar. 20, 2019

(86) PCT No.: PCT/JP2019/011679
§ 371 (c)(1),
(2) Date: Oct. 14, 2020

(87) PCT Pub. No.: WO2019/208034
PCT Pub. Date: Oct. 31, 2019

(65) Prior Publication Data
US 2021/0111277 A1 Apr. 15, 2021

(30) Foreign Application Priority Data
Apr. 27, 2018 (JP) .............................. JP2018-086845

(51) Int. Cl.
*H01L 29/778* (2006.01)
*H01L 29/45* (2006.01)
(Continued)

(52) U.S. Cl.
CPC ...... *H01L 29/778* (2013.01); *H01L 21/02573* (2013.01); *H01L 21/28* (2013.01);
(Continued)

(58) Field of Classification Search
CPC . H01L 29/778; H01L 21/02573; H01L 21/28; H01L 29/45; H01L 29/49;
(Continued)

(56) References Cited

U.S. PATENT DOCUMENTS

2006/0108606 A1* 5/2006 Saxler ................... H01L 21/318
257/E29.253
2007/0295990 A1 12/2007 Higashiwaka
(Continued)

FOREIGN PATENT DOCUMENTS

| CN | 105164810 A | 12/2015 |
| CN | 106796953 A | 5/2017 |

(Continued)

OTHER PUBLICATIONS

International Search Report and Written Opinion of PCT Application No. PCT/JP2019/011679, dated Jun. 18, 2019, 13 pages of ISRWO.

*Primary Examiner* — Duy T Nguyen
(74) *Attorney, Agent, or Firm* — Chip Law Group

(57) ABSTRACT

[Overview] [Problem to be Solved] To provide a switching transistor and a semiconductor module having lower distortion generated in a signal. [Solution] A switching transistor including: a channel layer including a compound semiconductor and having sheet electron density equal to or higher than $1.7 \times 10^{13}$ cm$^{-2}$; a barrier layer formed on the channel layer by using a compound semiconductor that is of a different type from the channel layer; a gate electrode provided on the barrier layer; and a source electrode and a drain electrode provided on the barrier layer with the gate
(Continued)

electrode interposed between the source electrode and the drain electrode.

13 Claims, 14 Drawing Sheets

(51) Int. Cl.
    *H01L 29/49*     (2006.01)
    *H01L 29/66*     (2006.01)
    *H01L 29/786*     (2006.01)
    *H01L 21/02*     (2006.01)
    *H01L 21/28*     (2006.01)

(52) U.S. Cl.
    CPC .............. *H01L 29/45* (2013.01); *H01L 29/49* (2013.01); *H01L 29/6653* (2013.01); *H01L 29/786* (2013.01)

(58) Field of Classification Search
    CPC .............. H01L 29/6653; H01L 29/786; H01L 29/41766; H01L 29/518; H01L 23/3171; H01L 23/3192; H01L 29/0847; H01L 29/513; H01L 29/66462; H01L 29/7783; H01L 29/7786; H01L 29/78696; H01L 29/2003; H01L 29/205; H01L 29/495; H01L 29/452
    USPC ......................................................... 257/192
    See application file for complete search history.

(56) References Cited

U.S. PATENT DOCUMENTS

| | | | |
|---|---|---|---|
| 2010/0038682 A1* | 2/2010 | Lahreche | H01L 29/778 |
| | | | 438/653 |
| 2010/0270559 A1* | 10/2010 | Ota | H01L 29/66462 |
| | | | 257/E21.445 |
| 2011/0127604 A1* | 6/2011 | Sato | H01L 29/402 |
| | | | 257/E29.252 |
| 2014/0327047 A1* | 11/2014 | Haider | H01L 29/2003 |
| | | | 257/288 |
| 2015/0060949 A1 | 3/2015 | Haider et al. | |
| 2015/0200287 A1* | 7/2015 | Beam, III | H01L 29/205 |
| | | | 257/194 |
| 2016/0225857 A1* | 8/2016 | Saito | H01L 21/0228 |
| 2017/0125545 A1* | 5/2017 | Yamada | H01L 29/7786 |
| 2017/0278959 A1 | 9/2017 | Then et al. | |
| 2018/0108768 A1 | 4/2018 | Makiyama | |

FOREIGN PATENT DOCUMENTS

| | | | |
|---|---|---|---|
| DE | 102015000190 | A1 | 7/2015 |
| EP | 1801865 | A1 | 6/2007 |
| EP | 2992557 | A1 | 3/2016 |
| EP | 3213350 | A1 | 9/2017 |
| JP | 2008-235613 | A | 10/2008 |
| JP | 2009-302370 | A | 12/2009 |
| JP | 2009302370 | * | 12/2009 |
| JP | 2011-159795 | A | 8/2011 |
| JP | 2012-049216 | A | 3/2012 |
| JP | 2015-135965 | A | 7/2015 |
| JP | 2015-207639 | A | 11/2015 |
| JP | 2016-522991 | A | 8/2016 |
| JP | 2017-085060 | A | 5/2017 |
| JP | 2017-539073 | A | 12/2017 |
| JP | 2018-064027 | A | 4/2018 |
| WO | 2006/022453 | A1 | 3/2006 |
| WO | 2014/179809 | A1 | 11/2014 |
| WO | 2016/068935 | A1 | 5/2016 |

* cited by examiner

[FIG. 1]
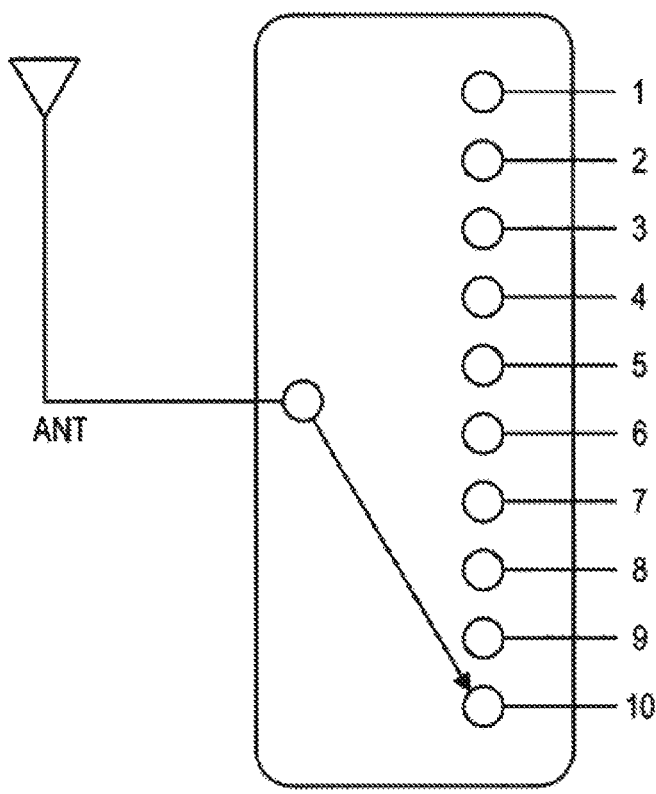
[FIG. 2A]
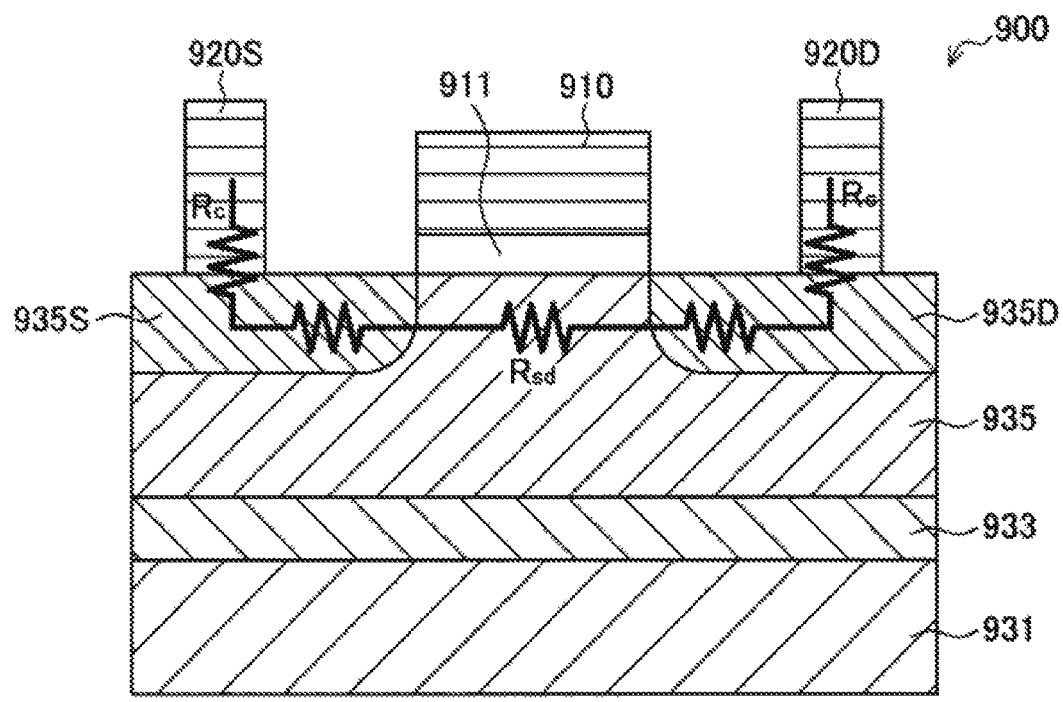

[FIG. 2B]
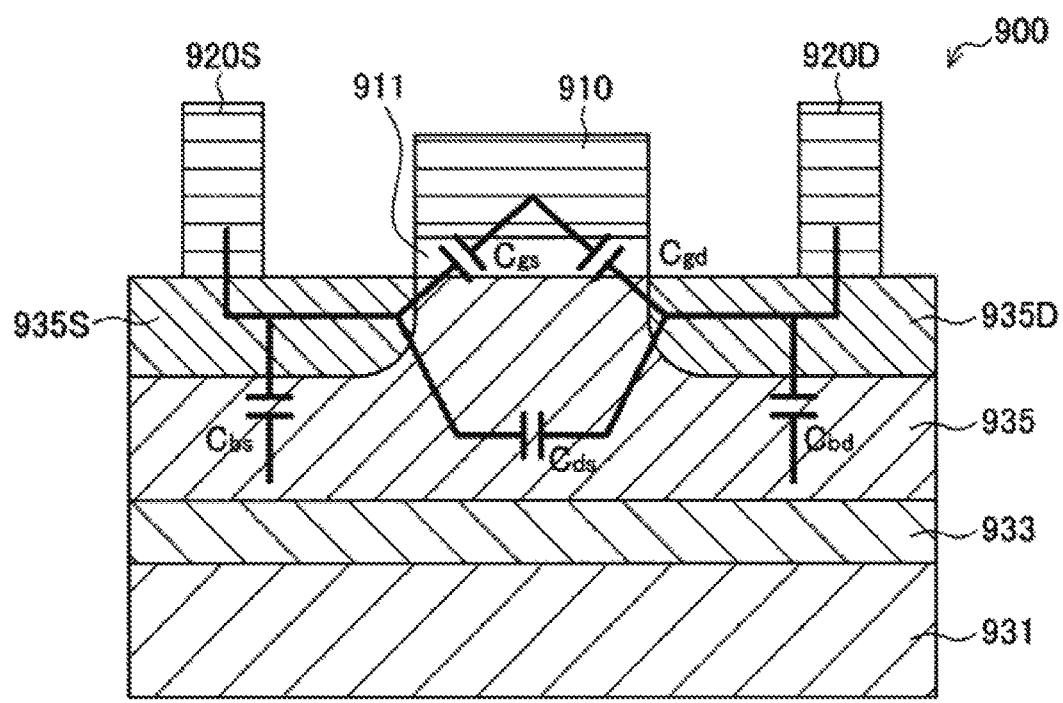
[FIG. 3]
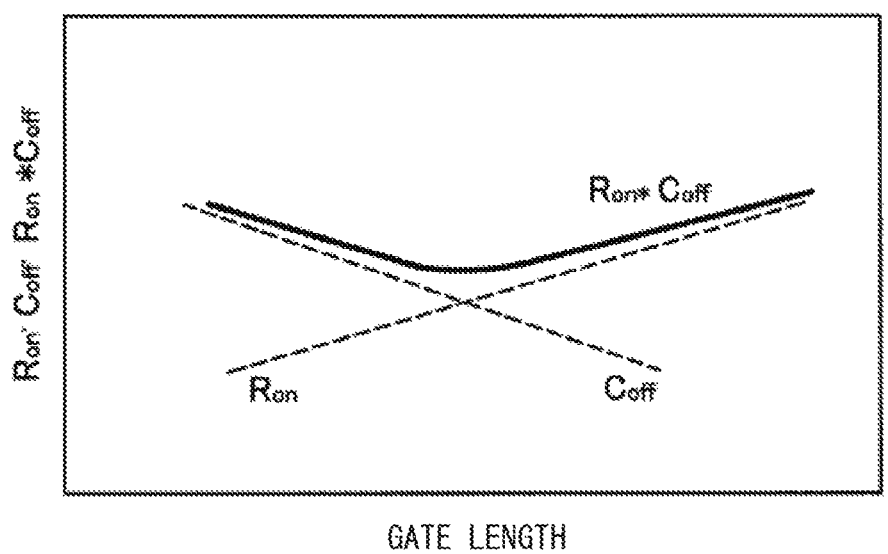

[FIG. 4]
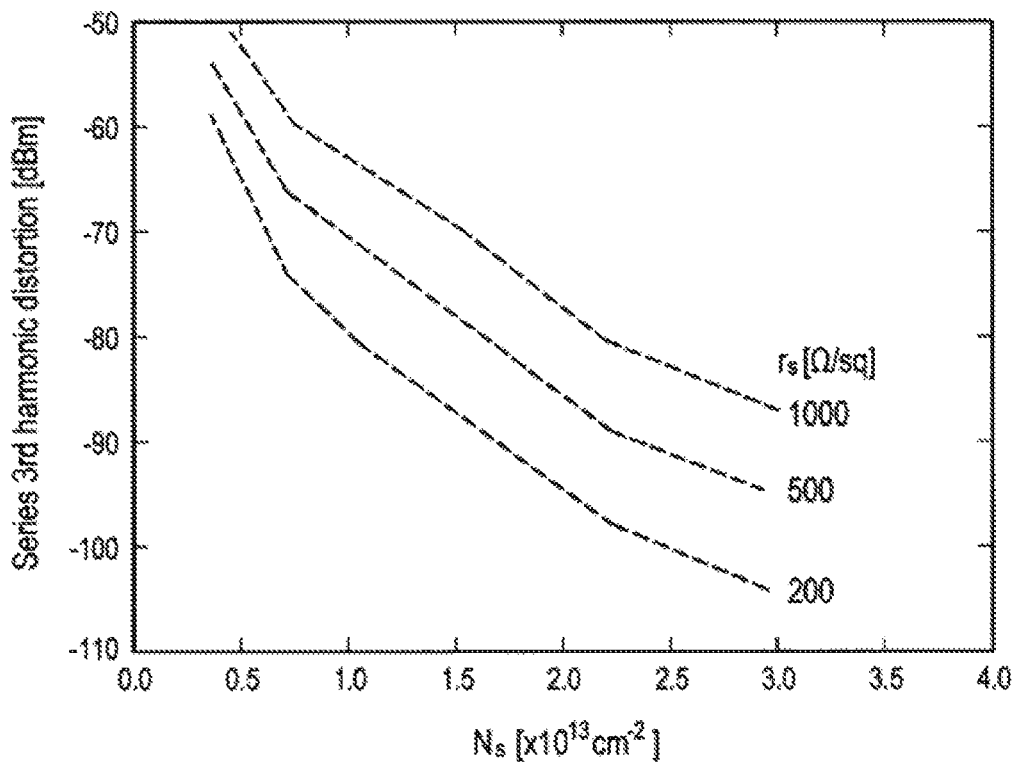
[FIG. 5]
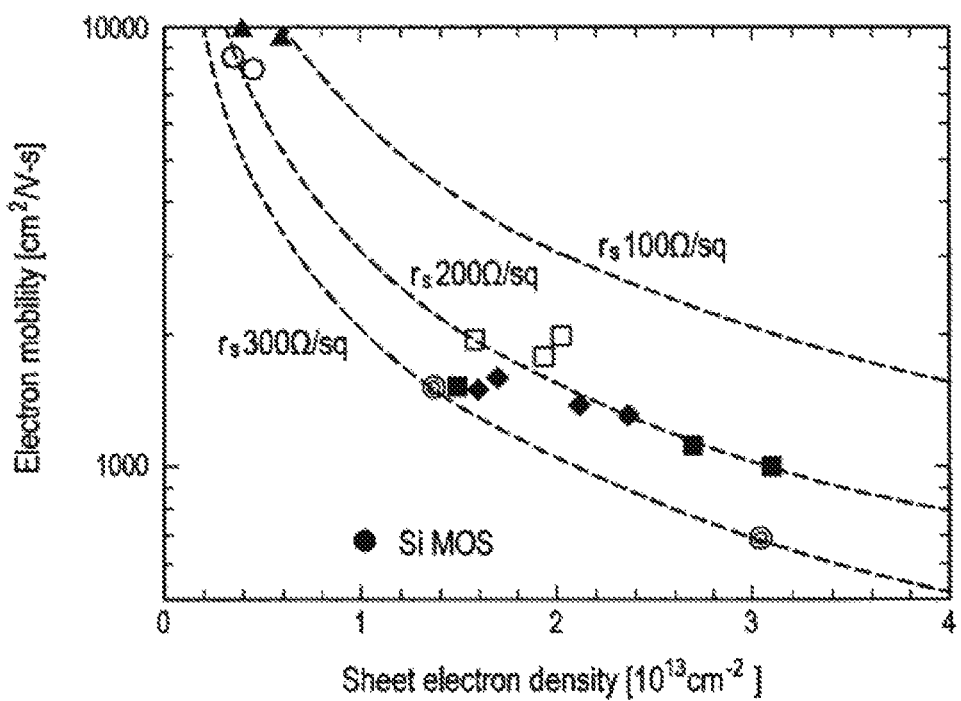

[FIG. 6]
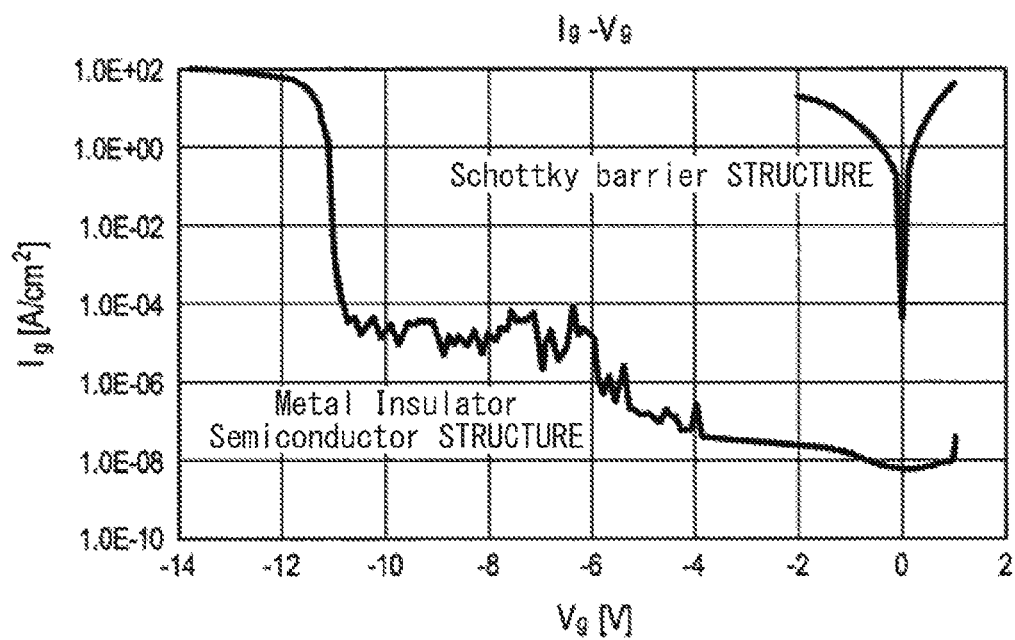

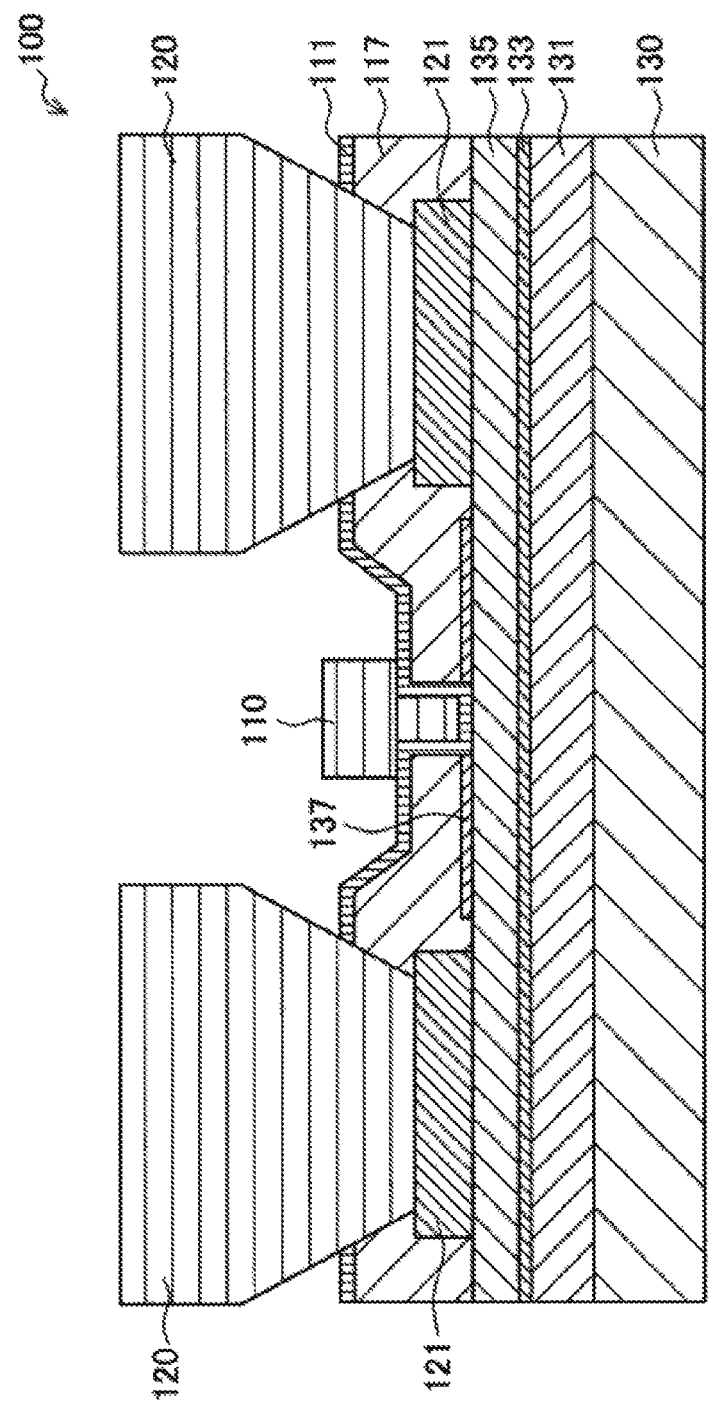
[FIG. 7]

[FIG. 8A]
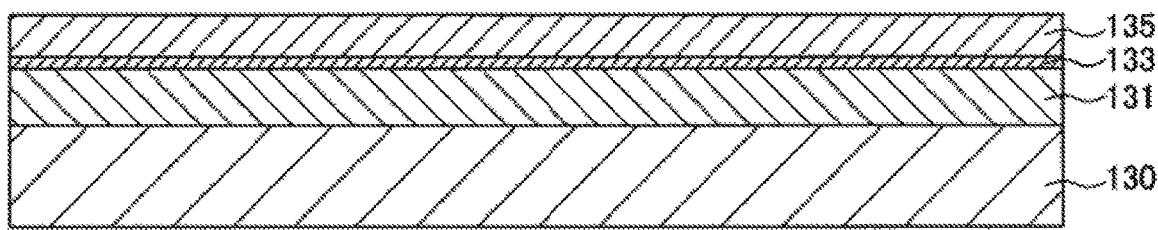
[FIG. 8B]
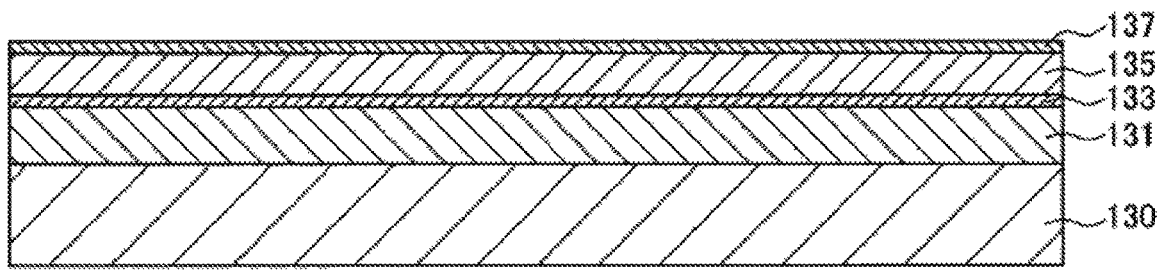
[FIG. 8C]
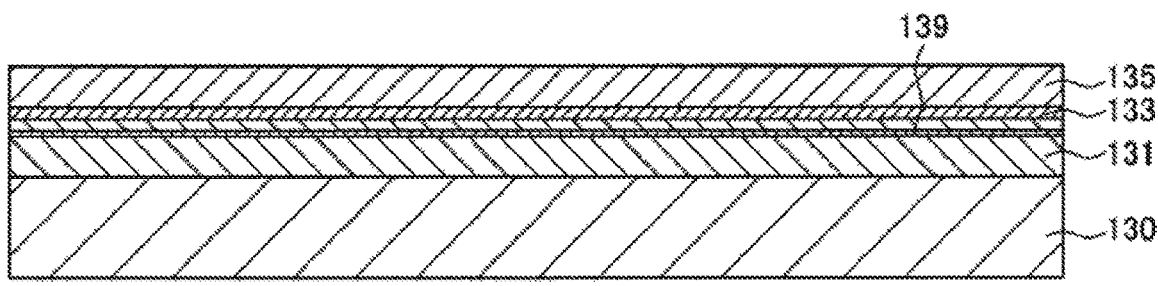

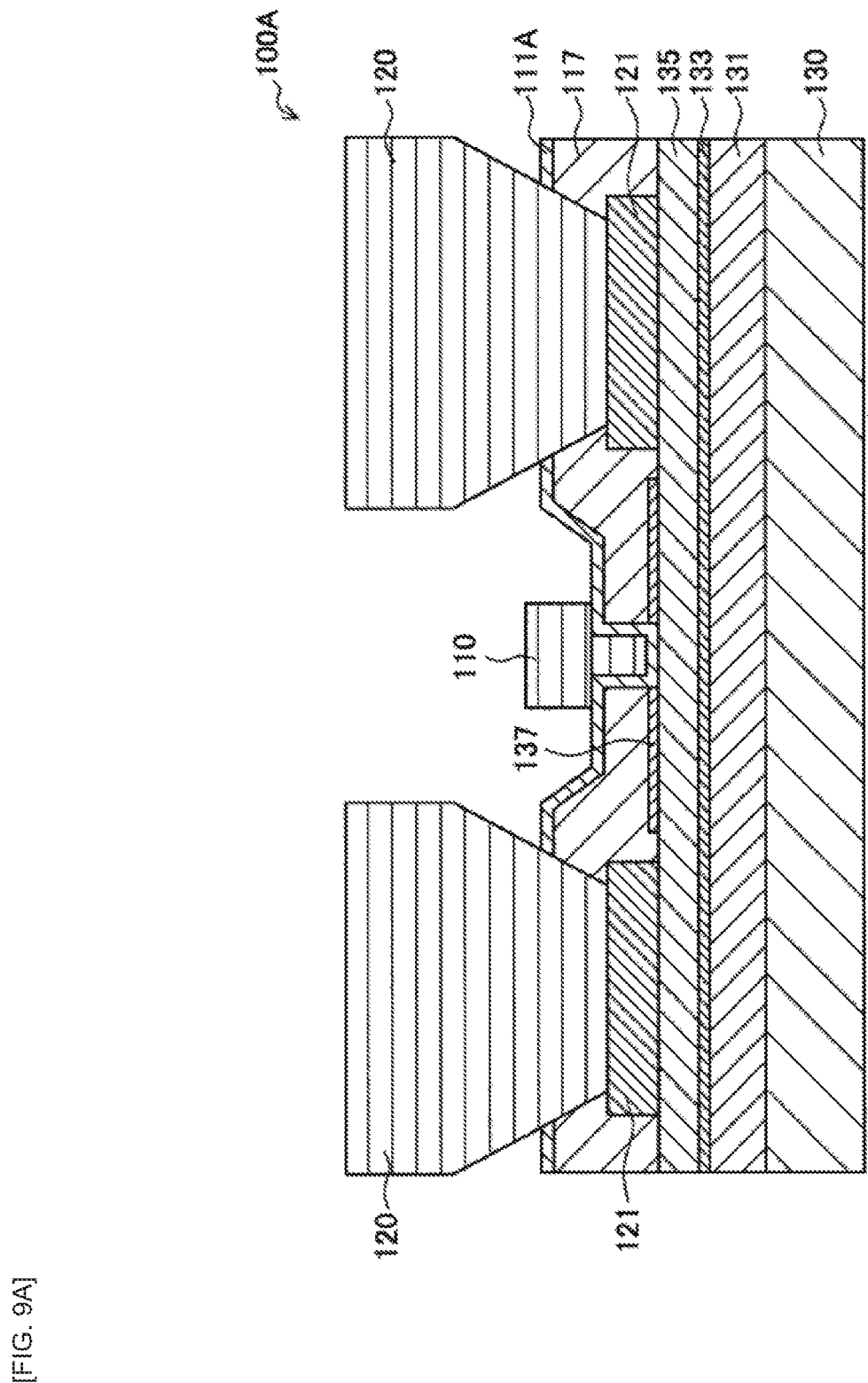
[FIG. 9A]

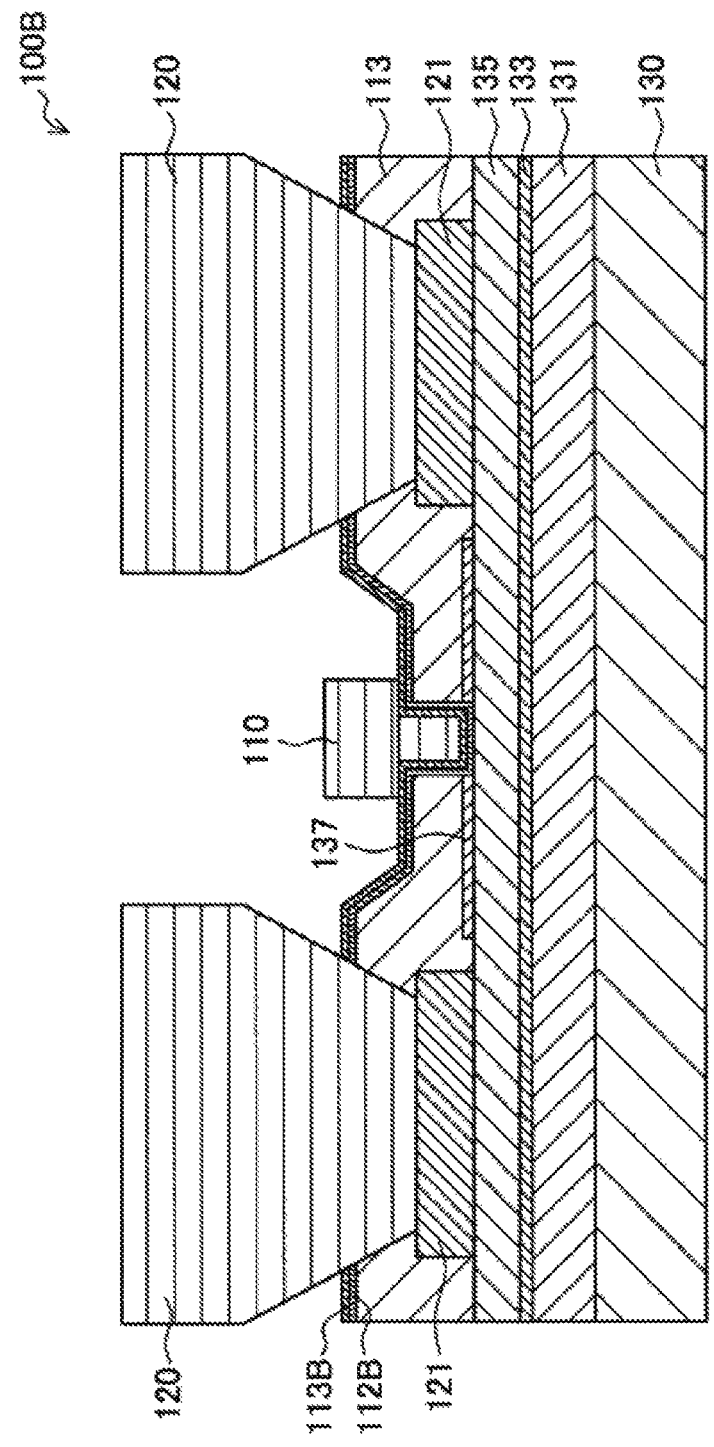
[FIG. 9B]

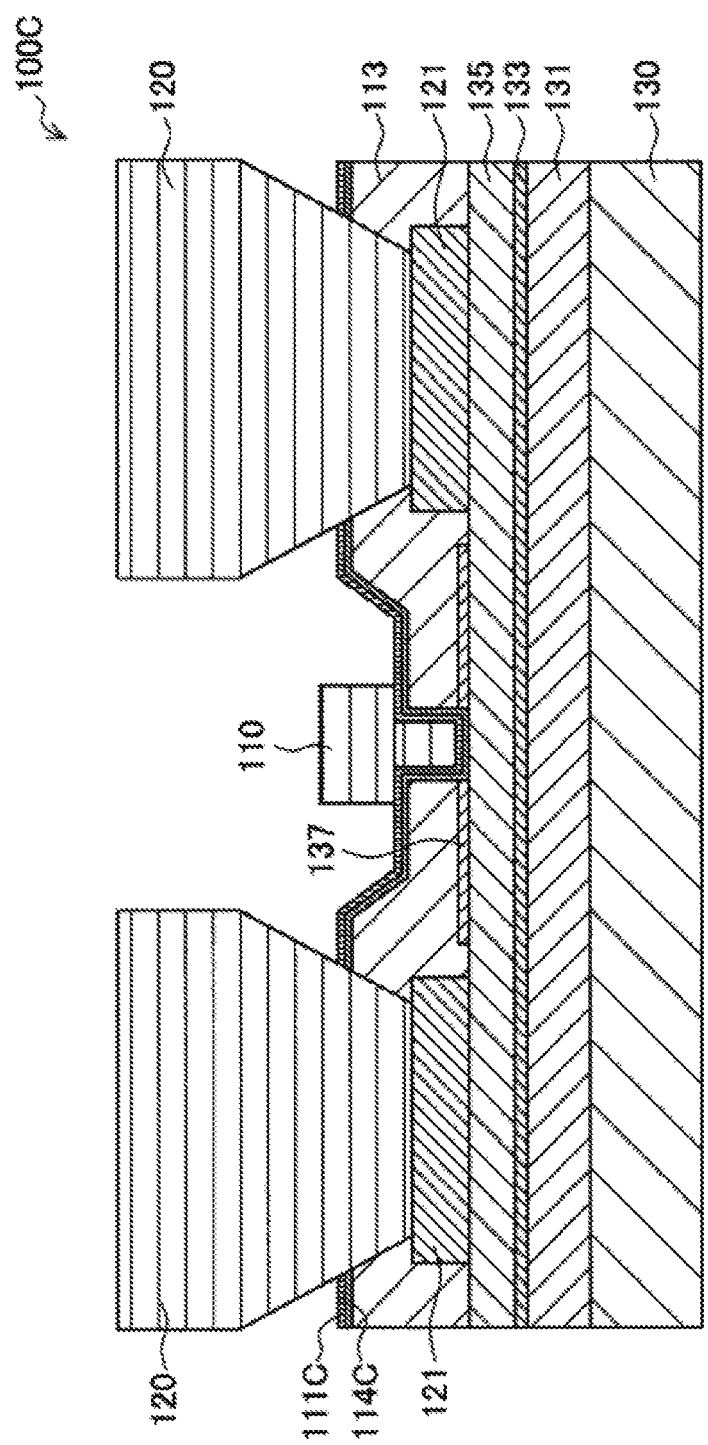
[FIG. 9C]

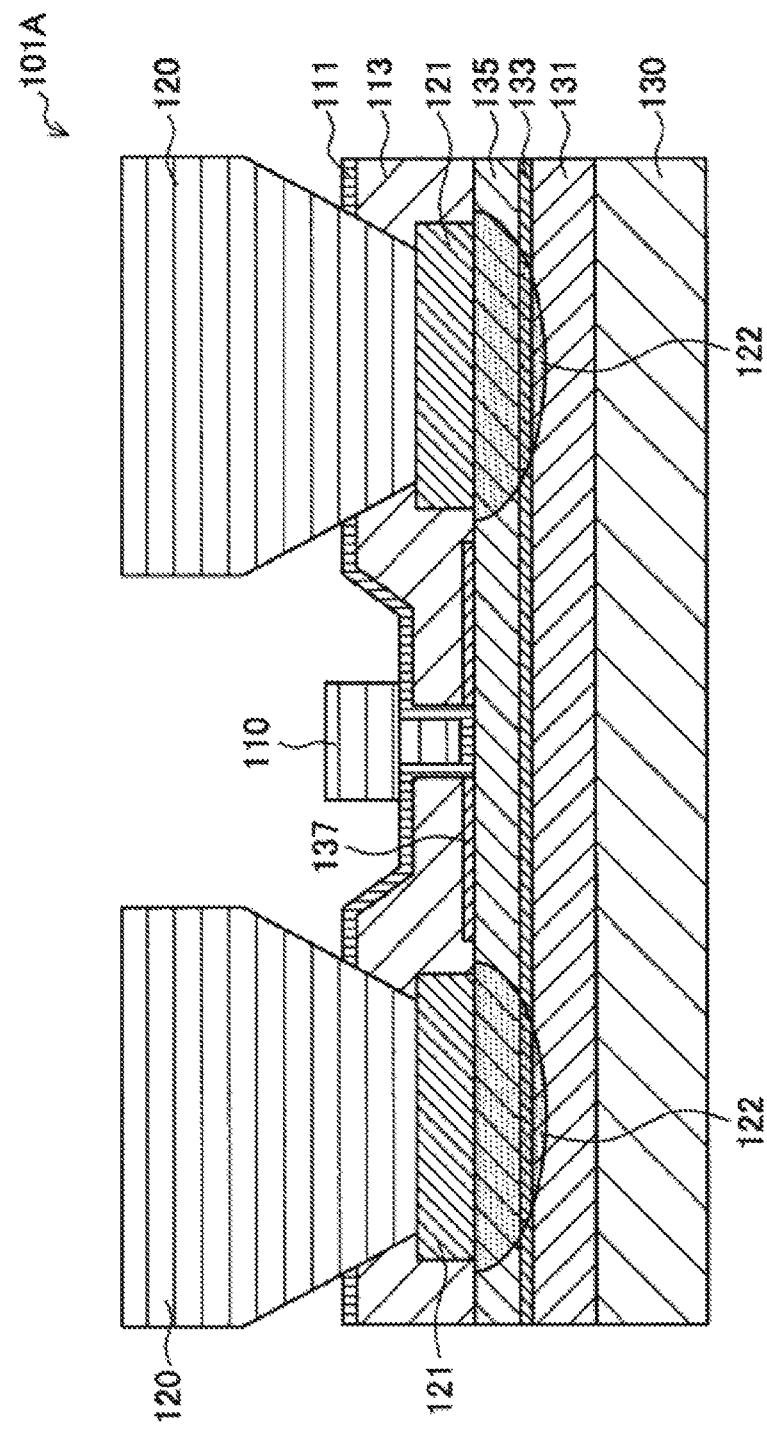
[FIG. 10A]

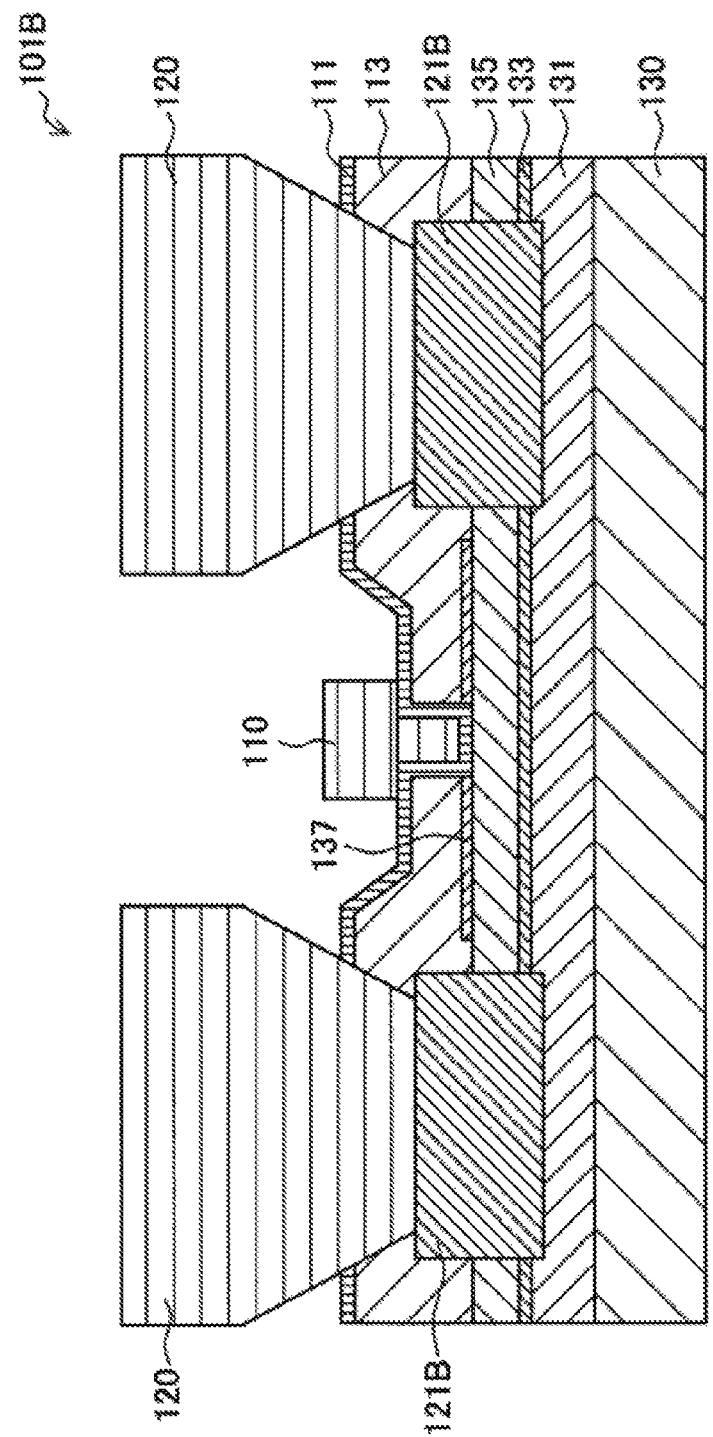
[FIG. 10B]

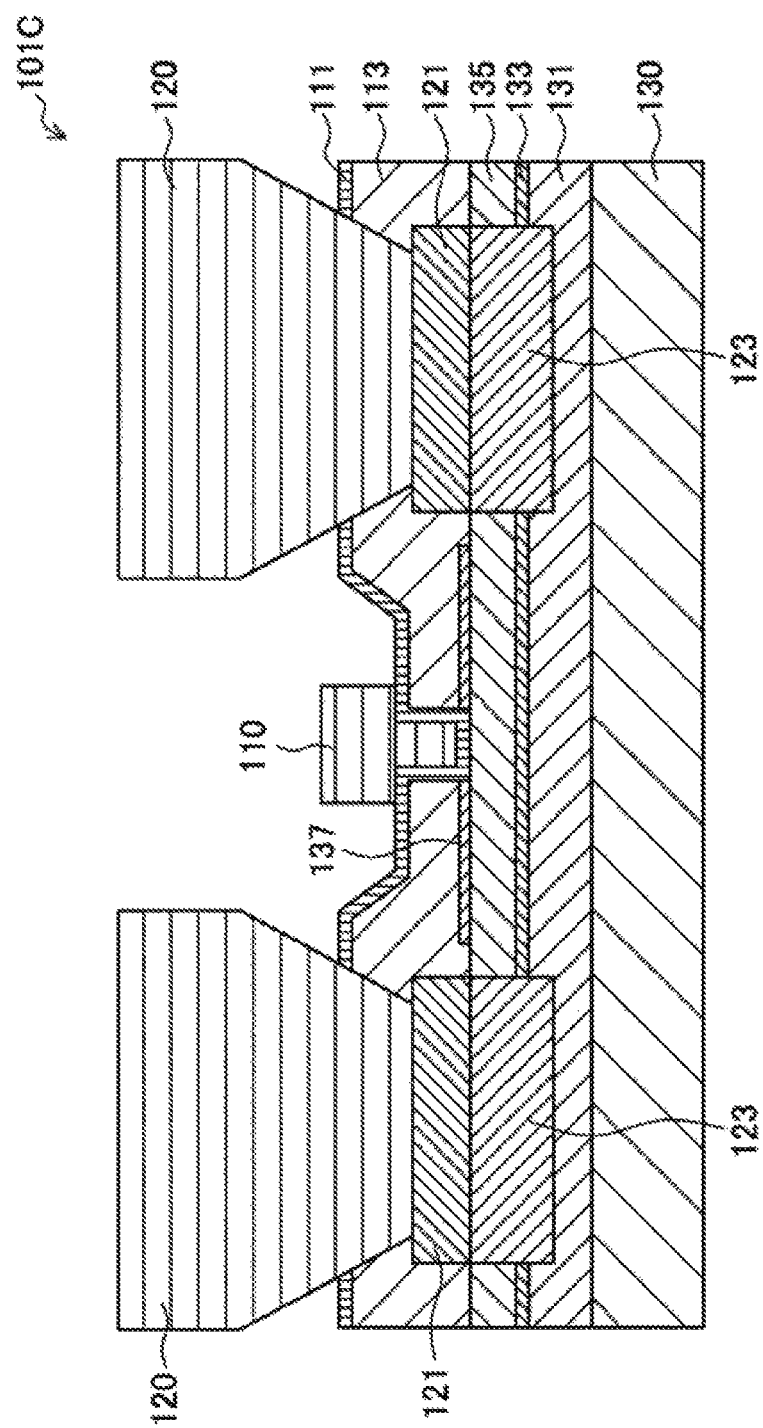
[FIG. 10C]

[FIG. 11]
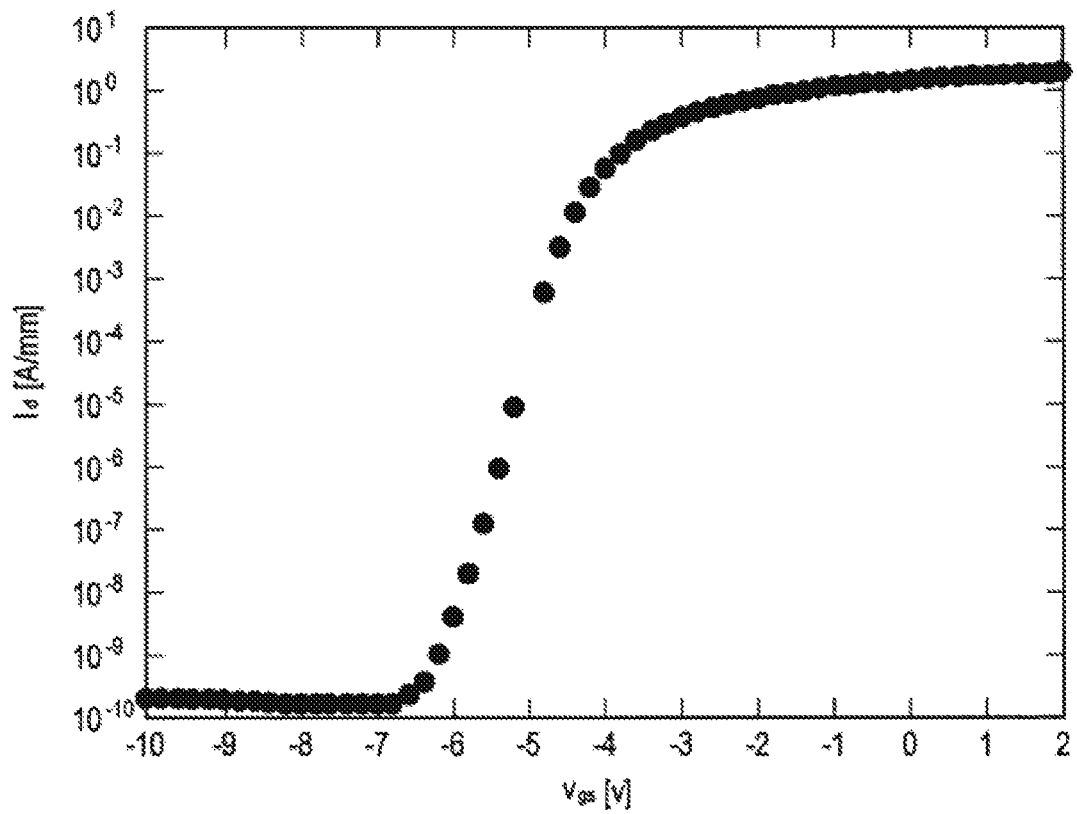
[FIG. 12]
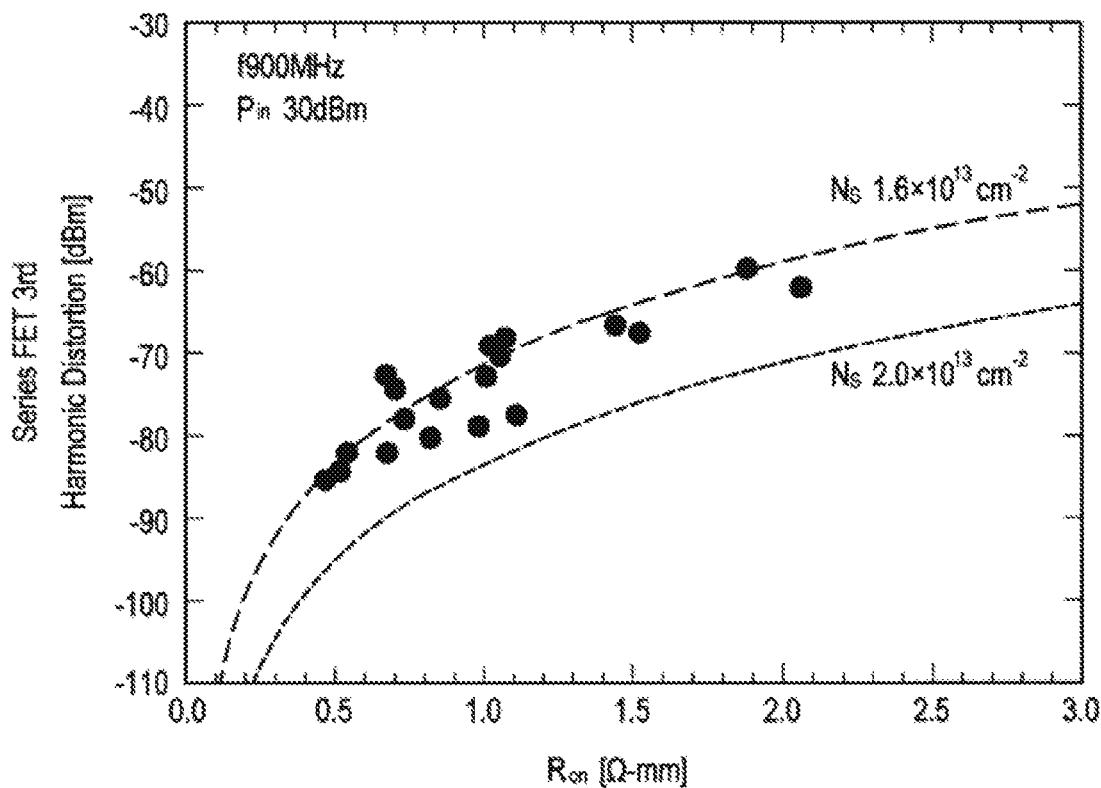

[FIG. 13]
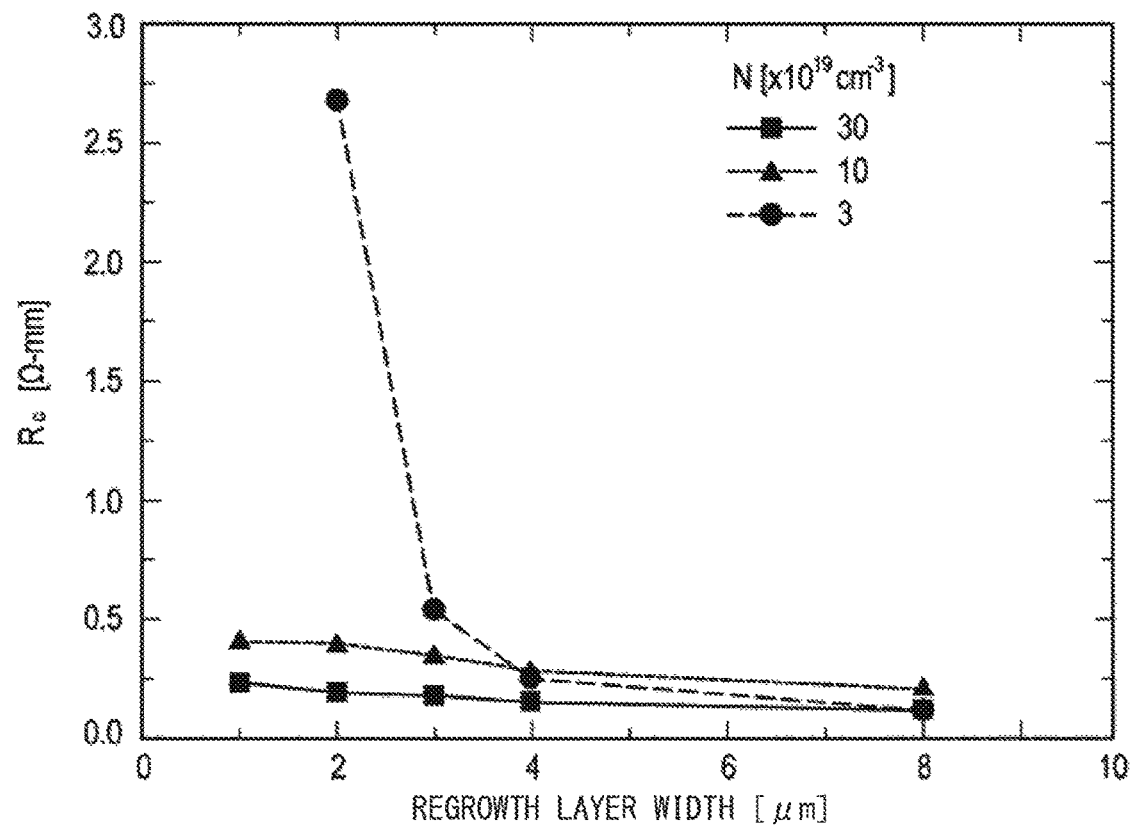
[FIG. 14]
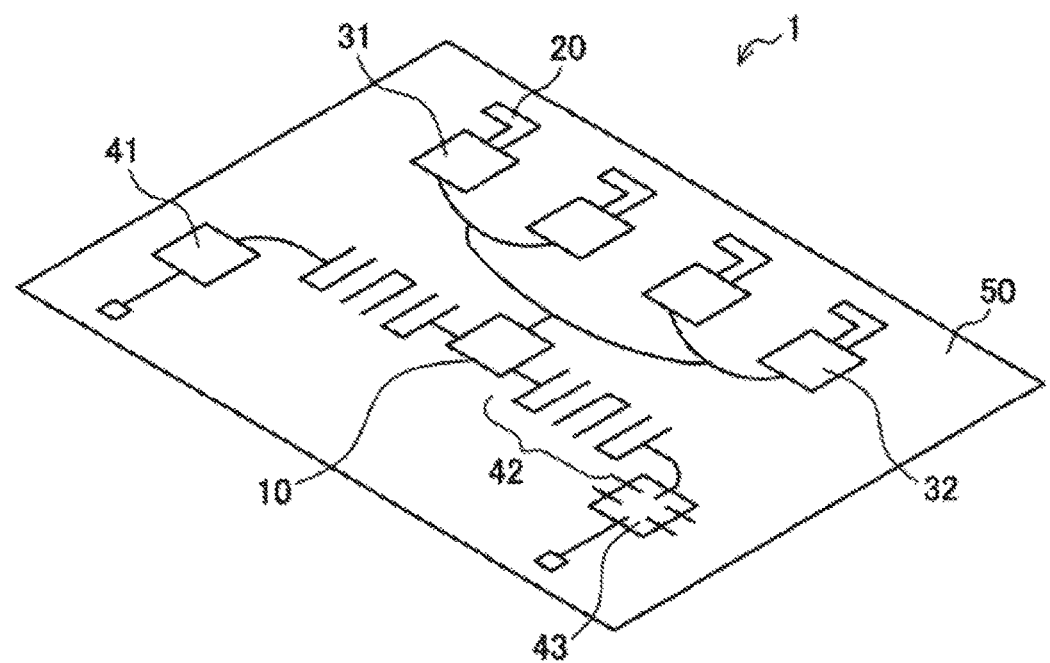

SWITCHING TRANSISTOR AND SEMICONDUCTOR MODULE TO SUPPRESS SIGNAL DISTORTION

CROSS REFERENCE TO RELATED APPLICATIONS

This application is a U.S. National Phase of International Patent Application No. PCT/JP2019/011679 filed on Mar. 20, 2019, which claims priority benefit of Japanese Patent Application No. JP 2018-086845 filed in the Japan Patent Office on Apr. 27, 2018. Each of the above-referenced applications is hereby incorporated herein by reference in its entirety.

TECHNICAL FIELD

The present disclosure relates to a switching transistor and a semiconductor module.

BACKGROUND ART

At a front end of a communication terminal such as a mobile phone, there is provided a high frequency switch (Radio Frequency-Switch: RF-SW). The high frequency switch is to switch high frequency (Radio Frequency: RF) transmission and reception.

Such a high frequency switch is requested to cause a signal from an antenna, a power amplifier (Power Amplifier: PA), or the like to pass with low loss, and to prevent distortion from being generated in a passing signal.

Here, as a method of implementing a high frequency switch with low loss and low distortion in an Si-based MOSFET (Metal-Oxide-Semiconductor), for example, use of an SOI (Silicon On Insulator) substrate is known that makes it possible to reduce a parasitic capacitance of an Si substrate (see PTL 1 below).

CITATION LIST

Patent Literature

PTL 1: Japanese Unexamined Patent Application Publication No. 2015-207639

SUMMARY OF THE INVENTION

Problems to be Solved by the Invention

However, with the technique disclosed in the PTL 1, it has been difficult to sufficiently suppress signal distortion generated in a signal that has passed through a high frequency switch.

Hence, the present disclosure proposes new and improved switching transistor and semiconductor module that make it possible to further suppress distortion of a passing signal.

Means for Solving the Problems

According to the present disclosure, there is provided a switching transistor including a channel layer, a barrier layer, a gate electrode, and a source electrode and a drain electrode. The channel layer includes a compound semiconductor and has a sheet electron density equal to or higher than $1.7 \times 10^{13}$ cm$^{-2}$. The barrier layer is formed on the channel layer by using a compound semiconductor of a different type from the channel layer. The gate electrode is provided on the barrier layer. The source electrode and the drain electrode are provided on the barrier layer, with the gate electrode interposed between the source electrode and the drain electrode.

In addition, according to the present disclosure, there is provided a semiconductor module including a substrate, various types of amplifiers provided on the substrate, and a switching transistor provided on the substrate and coupled to the various types of amplifiers. The switching transistor includes a channel layer, a barrier layer, a gate electrode, and a source electrode and a drain electrode. The channel layer includes a compound semiconductor and has a sheet electron density equal to or higher than $1.7 \times 10^{13}$ cm$^{-2}$. The barrier layer is formed on the channel layer by using a compound semiconductor of a different type from the channel layer. The gate electrode is provided on the barrier layer. The source electrode and the drain electrode are provided on the barrier layer, with the gate electrode interposed between the source electrode and the drain electrode.

According to the present disclosure, a two-dimensional electron gas formed in the channel layer has the high sheet electron density equal to or higher than $1.7 \times 10^{13}$ cm$^{-2}$. Here, high frequency distortion becomes smaller as the sheet electron density of a channel becomes higher. Therefore, the switching transistor according to an embodiment of the present disclosure makes it possible to further reduce the high frequency distortion.

Effects of the Invention

As described above, according to the present disclosure, it is possible to provide a switching transistor and a semiconductor module that further suppress distortion in a passing signal.

It is to be noted that the above-described effects are not necessarily limiting, and any effect described herein or other effects that are understandable herefrom may be provided, in addition to the above-described effects or in place of the above-described effects.

BRIEF DESCRIPTION OF DRAWINGS

FIG. 1 is a schematic diagram explaining an application example of a switching transistor according to an embodiment of the present disclosure.

FIG. 2A is a schematic cross-sectional diagram illustrating a structure and on-resistance of a switching transistor fabricated on a semiconductor substrate.

FIG. 2B is schematic cross-sectional diagram illustrating the structure and an off-capacitance of the switching transistor fabricated on the semiconductor substrate.

FIG. 3 is a graph chart schematically illustrating a correlation between a gate length of a transistor, and $R_{on}$, $C_{off}$, and $R_{on}*C_{off}$.

FIG. 4 is a graph chart illustrating correlativeness between a density Ns of an electron traveling in a channel and third-order harmonic distortion of a series transistor.

FIG. 5 is a scatter diagram illustrating a correspondence relation between an electron mobility and an electron density in an Si-based MOSFET and a compound semiconductor HEMT usable in a switching transistor.

FIG. 6 is a graph chart illustrating a difference in a shunt transistor characteristic with respect to a gate structure of an HEMT that uses AlInN.

FIG. 7 is a schematic cross-sectional diagram explaining a configuration of a switching transistor according to the embodiment of the present disclosure.

FIG. 8A is a schematic cross-sectional diagram illustrating an example of a substrate used in the switching transistor according to the embodiment.

FIG. 8B is a schematic cross-sectional diagram illustrating an example of a substrate used in the switching transistor according to the embodiment.

FIG. 8C is a schematic cross-sectional diagram illustrating an example of a substrate used in the switching transistor according to the embodiment.

FIG. 9A is a schematic cross-sectional diagram illustrating an example of a gate structure used in the switching transistor according to the embodiment.

FIG. 9B is a schematic cross-sectional diagram illustrating an example of a gate structure used in the switching transistor according to the embodiment.

FIG. 9C is a schematic cross-sectional diagram illustrating an example of a gate structure used in the switching transistor according to the embodiment.

FIG. 10A is a schematic cross-sectional diagram illustrating an example of a contact structure used in the switching transistor according to the embodiment.

FIG. 10B is a schematic cross-sectional diagram illustrating an example of a contact structure used in the switching transistor according to the embodiment.

FIG. 10C is a schematic cross-sectional diagram illustrating an example of a contact structure used in the switching transistor according to the embodiment.

FIG. 11 is a graph chart illustrating a Transfer characteristic of the switching transistor illustrated in FIG. 7.

FIG. 12 is a graph chart illustrating an evaluation result of a third-order harmonic distortion characteristic of the switching transistor illustrated in FIG. 7.

FIG. 13 is a graph chart illustrating a relation between a size of an ohmic regrowth layer and an ohmic characteristic of the switching transistor illustrated in FIG. 10C.

FIG. 14 is a schematic perspective view explaining a semiconductor module to which the switching transistor according to the embodiment is applied.

MODES FOR CARRYING OUT THE INVENTION

In the following, a preferred embodiment of the present disclosure is described below in detail with reference to the drawings. It is to be noted that, in this specification and the drawings, components having substantially identical functions and configurations are denoted by same reference numerals, and redundant description thereof is omitted.

It is to be noted that description is given in the following order.
1. Technological Background of the Present Disclosure
2. Overview of Technology According to the Present Disclosure
3. Configuration of Switching Transistor
4. Modification Examples
　4.1. Modification Example of Substrate
　4.2. Modification Example of Gate Structure
　4.3. Modification Example of Contact Structure
5. Characteristics of Switching Transistor
6. Application Example

1. TECHNOLOGICAL BACKGROUND OF THE PRESENT DISCLOSURE

First, description is given of a technological background of the present disclosure, with reference to FIG. 1 to FIG. 3. FIG. 1 is a schematic diagram explaining an application example of a switching transistor according to an embodiment of the present disclosure.

In a portable communication terminal such as a smart phone, a mobile phone, or a tablet terminal, a multitude of high frequency switches (Radio Frequency-Switch: RF-SW) are provided for switching of an RF (Radio Frequency) signal.

Specifically, as illustrated in FIG. 1, a high frequency switch is provided at a front end of the portable communication terminal. The high frequency switch allocates RF signals from an antenna ANT to a plurality of input/output ports. For example, the high frequency switch illustrated in FIG. 1 is a SP10T (Single Pole 10 Through: single-pole-ten-throw) switch. The high frequency switch illustrated in FIG. 1 includes one pole coupled to the antenna ANT, 10 input/output ports that receive the RF signals from the antenna ANT, and one contact that switches ON or OFF between the one pole and the 10 input/output ports. It is possible to configure such a high frequency switch by a switching transistor, for example.

The switching transistor to be used in such a high frequency switch is requested to have low loss from a standpoint of reducing power consumption of a portable communication terminal in which the switching transistor is to be mounted.

On the other hand, since the fourth generation, with an aim to increase a transmission capacitance, a technology called carrier aggregation (Carrier Aggregation: CA) using a plurality of frequency bands has been introduced to the portable communication terminal such as the smart phone, the mobile phone, or the tablet terminal. The CA is a technology to increase the transmission capacitance by bundling the plurality of frequency bands and forming a virtually wide band.

In a case where the CA is used, however, the plurality of frequency bands is bundled into one. Consequently, the plurality of frequency bands influences each other, thus resulting in a reduction in the transmission capacitance in some cases. For example, in a case where a frequency band of 700 MHz and a frequency band of 2.1 GHz are bundled by means of the CA, a third-order harmonic of 700 MHz becomes a noise source for the 2.1 GHz. Therefore, the transmission capacitance decreases due to the noise in some cases.

Therefore, in the switching transistor for a high frequency switch application to be mounted in the portable communication terminal, it has been requested to further suppress harmonic distortion. In particular, in recent years, in the portable communication terminal, to further increase the transmission capacitance, the number of frequency bands to be used in the CA has been on the rise, and a switching transistor with lower distortion has been requested.

Therefore, the switching transistor for the high frequency switch application to be mounted in the portable communication terminal has been requested to have lower loss and lower distortion.

Examples of such a switching transistor for the high frequency switch application may include a silicon (Si)-based MOSFET (Metal-Oxide-Semiconductor Field-Effect Transistor). Specifically, to suppress influence of an Si substrate that causes a parasitic capacitance, the MOSFET provided on an SOI (Silicon On Insulator) substrate is used as the switching transistor.

Here, FIGS. 2A and 2B each illustrate a structure of the MOSFET formed on the SOI substrate as an example of the switching transistor. FIG. 2A is a schematic cross-sectional diagram illustrating a structure and on-resistance of a switching transistor fabricated on a semiconductor substrate, and FIG. 2B is schematic cross-sectional diagram illustrating the structure and an off-capacitance of the switching transistor fabricated on the semiconductor substrate.

As illustrated in FIGS. 2A and 2B, a MOSFET-type switching transistor 900 is provided on the SOI substrate in which a substrate 931, a BOX layer 933, and a semiconductor layer 935 are stacked in sequence. The substrate 931 is a silicon substrate, for example. The BOX layer 933 is a silicon oxide layer. The semiconductor layer 935 is a silicon layer. The SOI substrate may be formed, for example, by ion implanting oxygen molecules into an inside of the silicon substrate and oxidizing the silicon substrate to make it the BOX layer 933. Alternatively, the SOI substrate may be formed, for example, by bonding together a carrier wafer on which the BOX layer 933 and the semiconductor layer 935 are formed, and the substrate 931, and then peeling off the carrier wafer.

A gate electrode 910 is provided on the semiconductor layer 935 via a gate insulating film 911. The gate electrode 910 may include polysilicon, or the like, for example. The gate insulating film 911 may include silicon oxide ($SiO_2$), for example.

A second conductivity type impurity is introduced to the semiconductor layer 935. The second conductivity type impurity is a p-type impurity such as boron or aluminum, for example. In addition, introduction of a first conductivity type impurity to the semiconductor layer 935 on both sides of the gate electrode 910 forms a source region 935S and a drain region 935D. The first conductivity type impurity is an n-type impurity such as phosphorus or arsenic, for example.

A source contact 920S and a drain contact 920D are provided on the source region 935S and the drain region 935D, respectively. The source contact 920S and the drain contact 920D may include a conductive material such as tungsten, titanium, aluminum, or copper, for example.

Here, as illustrated in FIG. 2A, the switching transistor 900 is denoted as an equivalent circuit including on-resistance $R_{on}$ (Ω·mm) when being on. The on-resistance $R_{on}$ may be generated, for example, due to continuity resistance $R_{sd}$ of a channel between the source region 935S and the drain region 935D, contact resistance Rc between the source contact 920S and the drain contact 920D, and the source region 935S and the drain region 935D, diffusion resistance of the source region 935S and the drain region 935D, and the like.

In contrast, as illustrated in FIG. 2B, the switching transistor 900 is denoted as the equivalent circuit including off-capacitance $C_{off}$ (C/mm) when being off. The off-capacitance $C_{off}$ may be generated, for example, by capacitances $C_{gs}$ and $C_{gd}$ between the source region 935S and the drain region 935D, and the gate electrode 910, a capacitance $C_{ds}$ between the source region 935S and the drain region 935D, capacitances $C_{bs}$ and $C_{bd}$ via a depletion layer between the source region 935S and the drain region 935D, and the semiconductor layer 935, and the like.

A figure of merit (FoM) (second) of the switching transistor 900 is defined as a product of the above-described on-resistance $R_{on}$ (Ω·mm) and the off-capacitance $C_{off}$ (C/mm). It may be said that the switching transistor 900 is a switching transistor which has lower loss as the FoM is smaller.

As illustrated in FIG. 3, however, the on-resistance $R_{on}$ and the off-capacitance $C_{off}$ are in a trade-off relation for a size of the switching transistor 900. FIG. 3 is a graph chart schematically illustrating a correlation between a gate length of the switching transistor 900, and $R_{on}$, $C_{off}$ and $R_{on}*C_{off}$.

Specifically, as the gate length of the switching transistor 900 becomes shorter, the off-capacitance $C_{off}$ increases although the on-resistance $R_{on}$ decreases. In addition, in a case where the switching transistor 900 is made to have multiple stages, the on-resistance $R_{on}$ increases although the off-capacitance $C_{off}$ decreases. Therefore, the MOSFET type switching transistor 900 formed on the SOI substrate aims to improve the FoM, for example, through the use of a decrease in the on-resistance $R_{on}$ due to miniaturization, a decrease in the off-capacitance $C_{off}$ due to provision of multiple stages attributable to a smaller device size, a decrease in the capacitances $C_{bs}$ and $C_{bd}$ due to a change from a PD-SOI (Partially-Depleted-SOI) to an FD-SOI (Fully-Depleted SOI), and the like.

In addition, examples of the switching transistor for the high frequency switch application other than the Si-based MOSFET may include a high electron mobility transistor (High Electron Mobility Transistor: HEMT). Specifically, the HEMT is a field-effect transistor that uses, as a channel, a two-dimensional electron gas with a high mobility induced by a semiconductor hetero-junction. The HEMT is, in general, formed by the hetero-junction of a compound semiconductor.

For example, in the HEMT in which GaAs and InGaAs, which are each the compound semiconductor, form a hetero-junction, a channel having an electron travelling is formed in an InGaAs layer. Such a GaAs-based HEMT exhibits the high electron mobility that is 6 times or higher with respect to the Si-based MOSFET. Consequently, it is possible to achieve extremely low sheet resistance and lower the on-resistance $R_{on}$ extremely. However, in the GaAs-based HEMT, it is not easy to promote reduction of a device size due to a restriction by an ohmic characteristic and it has been difficult to reduce the off-capacitance $C_{off}$ by reducing the device size. Therefore, the GaAs-based HEMT aims to improve the FoM by applying a large gate off voltage and reducing the off-capacitance $C_{off}$.

In the above-described transistor, however, adequate improvement of the low distortion has been difficult. To improve the harmonic distortion, it is important to consider influence of a nonlinear characteristic as well as basic wave characteristics of the transistor. In the switching transistor, however, a high-precision equivalent circuit that also incorporates nonlinearity has not been found yet. Therefore, it has been difficult to analyze a correspondence relation between a physical characteristic of the device and the harmonic distortion and to obtain an improvement guideline toward improvement of the characteristic. For example, although an attempt is made to polynomial approximate and analyze, with a fitting parameter, a current-voltage characteristic of a series transistor or a capacitance-voltage characteristic of a shunt transistor, the improvement guideline toward the improvement of the characteristic and a guideline on appropriate device selection have not been adequately obtained.

2. OVERVIEW OF TECHNOLOGY ACCORDING TO THE PRESENT DISCLOSURE

In light of the above-described circumstances, the present inventors have diligently reviewed the transistor with the low loss and the low distortion suitable as the switching transistor for the high frequency switch application. As a result, the present inventors have arrived at findings to be described below and have completed the technology according to the present disclosure. In the following, description is given of the technology according to the present disclosure, with reference to FIG. 4 to FIG. 6.

Specifically, the present inventors have found that in the switching transistor, there is correlativeness between the density of the electron travelling in the channel and the third-order harmonic distortion of the series transistor. In the review of the above-described Si-based MOSFET or the GaAs-based HEMT, and the like, it has been believed that the decrease in the on-resistance $R_{on}$, that is, the decrease in the sheet resistance of the channel is important to achieve the low loss and the low distortion.

The sheet resistance is determined by the density of the electron travelling in the channel and the electron mobility, and bears such a relationship that as the electron density becomes higher, the electron mobility decreases. Hence, as illustrated in FIG. 4, the present inventors have reviewed the correspondence relation between the electron density Ns and the third-order harmonic distortion with the sheet resistance fixed, and have found that there is favorable correlativeness between the electron density Ns and the third-order harmonic distortion. FIG. 4 is a graph chart illustrating the correlativeness between the density Ns of the electron traveling in the channel and the third-order harmonic distortion of the series transistor.

In the graph of FIG. 4, dashed lines are drawn so that the sheet resistance is fixed. Toward the right on the dashed line, the electron density increases and the electron mobility decreases. With reference to FIG. 4, it is seen that increasing the electron density Ns of the channel greatly improves the high frequency characteristic although the electron mobility decreases. Therefore, it is possible to make the transistor have the lower distortion by performing a device design that makes the electron density Ns of the channel higher.

As a matter of course, if the electron density Ns is same, the higher electron mobility makes it possible to improve the characteristic such as the on-resistance $R_{on}$, but the electron mobility has a smaller range of fluctuation than the electron density Ns. Therefore, it is believed that performing the device design giving importance to the electron density that allows for improvement of the high frequency characteristic makes it possible to implement the switching transistor that is more suitable for the high frequency application.

Here, FIG. 5 is a scatter diagram illustrating the correspondence relation between the electron mobility and the electron density in the Si-based MOSFET and the compound semiconductor usable in the switching transistor. It is to be noted that the dashed lines in FIG. 5 are lines that indicate identical sheet resistance.

In FIG. 5, a filled triangle represents a plot of a laminated body of InAlAs/InGaAs and a white outlined circle represents a plot of a laminated body of AlGaAs/InGaAs. In addition, a double circle represents a plot of a laminated body of AlGaN/GaN. Furthermore, a white outlined square represents a plot of a laminated body of AlGaInN/GaN/SiC, a filled square represents a plot of a laminated body of AlInN/GaN/Sapphire, and a filled diamond shape represents a plot of a laminated body of AlInN/GaN/Si.

According to FIG. 5, it is seen that the HEMT using GaAs and the like has the low electron density Ns of 3 to $4 \times 10^{12}$ cm$^{-2}$ although it has the favorable electron mobility (electron transfer characteristic). In contrast, it is seen that the Si-based MOSFET (Si MOS) has the high electron density Ns of $1 \times 10^{13}$ cm$^{-2}$ although it has the low electron mobility. Here, according to FIG. 5, it is seen that a GaN-based material has the higher electron density than GaAs, etc. It is believed, in particular, that AlGaInN/GaN is a system that makes it possible to form the switching transistor for the high frequency application with the desired low loss and low distortion, because AlGaInN/GaN has the low sheet resistance of $200\Omega/\square$ and has the high electron density Ns equal to or higher than $1.7 \times 10^{13}$ cm$^{-2}$ and the high electron mobility.

On the basis of the findings described above, the present inventors have conceived the switching transistor according to the embodiment of the present disclosure. The switching transistor according to the present embodiment is the HEMT including a barrier layer and a channel layer that form a semiconductor hetero-junction and having the sheet electron density of the channel layer that is equal to or higher than $1.7 \times 10^{13}$ cm$^{-2}$.

It is to be noted that in the HEMT using AlGaInN having the high electron density, and the like, a leak characteristic between the barrier layer including AlGaInN and the gate electrode and the ohmic characteristic of coupling to the channel layer via the barrier layer may not be favorable in some cases. In a case where the leak characteristic between the barrier layer and the gate electrode is poor, a shunt characteristic of the transistor degrades. In contrast, in a case where the ohmic characteristic of coupling to the channel layer via the barrier layer is poor, it becomes difficult to achieve a desired switching characteristic.

Here, the present inventors have found that for degradation of the shunt characteristic of the transistor, adoption of a MIS (Metal-Insulator-Semiconductor) gate structure having an insulation layer interposed between the gate electrode and the barrier layer makes it possible to achieve an adequate shunt transistor characteristic. With reference to FIG. 6, a difference in the shunt transistor characteristic attributable to a difference in the gate structure is illustrated. FIG. 6 is a graph chart illustrating the difference in the shunt transistor characteristic with respect to the gate structure of the HEMT that uses AlInN.

As illustrated in FIG. 6, in a case of a Schottky gate structure (Schottky barrier structure in FIG. 6) in which the gate electrode (Ni/Au) is directly coupled to the barrier layer of the HEMT that uses AlInN, it is seen that application of a low negative voltage easily carries a gate current and that the achievement of the adequate shunt transistor characteristic is not possible. In contrast, it is seen that in a case of the MIS gate structure (Metal Insulator Semiconductor structure of FIG. 6) that has the insulating film interposed between the gate electrode (Ni/Au) and the barrier layer including AlInN, even application of the higher negative voltage makes it possible to achieve the adequate shunt transistor characteristic.

In addition, the present inventors have found that for the degradation of the ohmic characteristic of the transistor, a contact of the barrier layer with an electrode of each terminal causes the degradation of the ohmic characteristic. Hence, the present inventors have discovered that improvement of the contact of the barrier layer of the HEMT with the electrode of each terminal makes it possible to achieve the more favorable switching characteristic.

In the following, description is given of a specific configuration of the switching transistor according to the embodiment of the present disclosure that is conceived from the above-described findings of the present inventors.

3. CONFIGURATION OF SWITCHING TRANSISTOR

First, with reference to FIG. 7, description is given of a specific configuration of the switching transistor according to the present embodiment. FIG. 7 is a schematic cross-sectional diagram explaining the configuration of the switching transistor according to the present embodiment.

It is to be noted that in drawings referred to in the following description, sizes of some components may be exaggerated for the purpose of illustration. Therefore, relative sizes of components illustrated in the drawings do not necessarily represent a magnitude relation between actual components accurately. In addition, in the following description, a stacking direction of layers is represented as an up-down direction and a direction in which a support substrate is present is represented as a down direction.

As illustrated in FIG. 7, a switching transistor 100 includes a support substrate 130, a channel layer 131, a spacer layer 133, a barrier layer 135, a protection layer 137, ohmic metal layers 121, source or drain electrodes 120, an insulation layer 117, a gate insulating film 111, and a gate electrode 110.

The support substrate 130 is a substrate that supports each component of the switching transistor 100. The support substrate 130 may be, for example, a substrate including a III-V compound semiconductor material and may be, for example, a single-crystalline gallium nitride (GaN) substrate having semi-insulation properties. In a case where the channel layer 131 to be described later is provided, however, a material that the support substrate 130 includes is not limited in particular. In such a case, the support substrate 130 may be a silicon (Si) substrate, a silicon carbide (SiC) substrate, a sapphire substrate, or the like.

The channel layer 131 includes a compound semiconductor material and is provided on the support substrate 130. In the channel layer 131, the electron travels due to the semiconductor hetero-junction with the barrier layer 135, to be described later, and the two-dimensional electron gas serving as the channel is formed. The channel layer 131 may include GaN, for example, and may include InGaN or AlGaN.

It is to be noted that a buffer layer may be provided between the channel layer 131 and the support substrate 130 to alleviate a difference between a lattice constant of the support substrate 130 and that of the channel layer 131. For example, the buffer layer may include a material having a lattice constant that is intermediate between the lattice constant of the material that the channel layer 131 includes and the lattice constant of a material that the support substrate 130 includes. Provision of the appropriate buffer layer makes a crystal state of the channel layer 131 favorable and suppresses overall warping of the switching transistor 100.

The barrier layer 135 includes a compound semiconductor material that is of a different type from the channel layer 131, and is provided on the channel layer 131. The barrier layer 135 accumulates the electron in the channel layer 131 by the hetero-junction with the channel layer 131 and forms the two-dimensional electron gas in the channel layer 131. For example, in a case where the channel layer 131 includes GaN, the barrier layer 135 may include $Al_{1-x-y}Ga_xIn_yN$ (where $0<x<1$, $0<y<1$, $0<x+y<1$).

In the present embodiment, the compound semiconductor materials that the channel layer 131 and the barrier layer 135 include are selected so that the sheet electron density of the channel layer 131 is equal to or higher than $1.7\times10^{13}$ cm$^{-2}$. That is, as described above, the channel layer 131 may include GaN and the barrier layer 135 may include $Al_{1-x-y}Ga_xIn_yN$ (where $0<x<1$, $0<y<1$, $0<x+y<1$). In such a case, the channel layer 131 and the barrier layer 135 make it possible to cause the two-dimensional electron gas formed in the channel layer 131 to have the sheet electron density equal to or higher than $1.7\times10^{13}$ cm$^{-2}$. However, if it is possible to make the sheet electron density of the two-dimensional electron gas formed in the channel layer 131 be equal to or higher than $1.7\times10^{13}$ cm$^{-2}$, types of the respective compound semiconductor materials that form the channel layer 131 and the barrier layer 135 are not limited to the above-described combination.

The spacer layer 133 is provided so as to be inserted between the barrier layer 135 and the channel layer 131. The spacer layer 133 includes a compound semiconductor material having larger polarization than the barrier layer 135 and improves the electron mobility of the two-dimensional electron gas formed in the channel layer 131. In a case where the barrier layer 135 and the channel layer 131 are of the above-described AlGaInN/GaN combination, the spacer layer 133 may include AlN, for example. However, the spacer layer 133 may include InGaN, AlGaN, or the like.

The protection layer 137 includes an insulating material and is provided on the barrier layer 135 of a region where the gate electrode 110, and the source or drain electrode 120 are not provided. The protection layer 137 is provided to protect the barrier layer 135 from an impurity such as ion in a manufacturing process of the switching transistor 100. The protection layer 137 is removed in the region where the gate electrode 110 and the source or the drain electrode 120 are provided, as these electrodes are formed. The protection layer 137 may include the insulating material such as GaN, $SiO_2$, SiN, or $Al_2O_3$, for example.

The insulation layer 117 includes an insulating material and is provided on the barrier layer 135. The insulation layer 117 electrically insulates the barrier layer 135 from an electrode, a wiring line, or the like. However, on the insulation layer 117, an opening is provided that corresponds to the region where the gate electrode 110 and the source or drain electrode 120 are provided. This allows the gate electrode 110 and the source or drain electrode 120 to electrically contact the barrier layer 135. For example, the insulation layer 117 may be formed as a single-layer film or a laminated film of the insulating material such as $SiO_2$, SiN, or $Al_2O_3$, for example.

The gate insulating film 111 includes a dielectric material having the insulation properties and is provided on the barrier layer 135. Specifically, the gate insulating film 111 may be provided uniformly over the barrier layer 135 and the insulation layer 117. The gate insulating film 111 may include an oxide such as $SiO_2$, $Al_2O_3$, or $HfO_2$ or a nitride such as SiN, AlN, or BN.

The gate electrode 110 includes a conductive material and is provided on the gate insulating film 111. Specifically, the gate electrode 110 may be provided on the opening provided on the insulation layer 117, so as to contact the barrier layer 135 via the gate insulating film 111. The gate electrode 110 may include the single-layer film or the laminated film of Ti, Al, Ni, Au, or the like, for example.

That is, in the switching transistor 100, the gate electrode 110, by being provided on the barrier layer 135 via the gate insulating film 111, forms the MIS (Metal-Insulator-Semiconductor) gate structure. In the MIS gate structure, application of a voltage to the gate electrode 110 modulates a band state of the barrier layer 135 and modulates the electron density of the two-dimensional electron gas formed in the channel layer 131. Therefore, in the switching transistor 100, the application of the voltage to the gate electrode 110 makes it possible to control the electron density of the two-dimensional electron gas and modulate a current flowing between the source or drain electrodes 120. Such a MIS gate structure allows the switching transistor 100 to suppress a gate leak current, thus making it possible to achieve the adequate shunt transistor characteristic.

The ohmic metal layer 121 includes a conductive material and is provided on the barrier layer 135. By forming an ohmic junction with the barrier layer 135, the ohmic metal layer 121 reduces the contact resistance between the source or drain electrode 120 and the two-dimensional electron gas (channel) formed in the channel layer 131. The ohmic metal layer 121 may include the single-layer film or the laminated film of metal having a small work function, such as Ti, Al, Ni, or Au, for example. Because the ohmic metal layer 121 allows for improvement of the ohmic characteristic between the source or drain electrode 120 and the barrier layer 135, it is possible to improve the switching characteristics of the switching transistor 100.

The source or drain electrode 120 includes a conductive material and is provided on the ohmic metal layer 121. The source or drain electrode 120 contacts the two-dimensional electron gas (channel) formed in the channel layer 131, via the ohmic metal layer 121. The source or drain electrode 120 may include a general wiring line material such as Cu or Al, for example. It is to be noted that the source or drain electrodes 120 are provided on both sides with the gate electrode 110 interposed therebetween, and one is the source electrode and the other the drain electrode.

With the above-described configuration, the switching transistor 100 according to the present embodiment is provided as the HEMT having the high electron density of the channel, thus making it possible to achieve the characteristics of the low loss and the low distortion. Therefore, it is possible to use the switching transistor 100 suitably for the high frequency application.

In addition, it is possible for the switching transistor 100 to improve the shunt transistor characteristic by including the MIS gate structure. Furthermore, by including the ohmic metal layer 121, the switching transistor 100 allows for the improvement of the ohmic characteristic between the source or drain electrode 120 and the barrier layer 135, thus making it possible to improve the switching characteristics.

Formation of the switching transistor 100 according to the present embodiment is possible by repeating film formation by means of sputtering or CVD (Chemical Vapor Deposition), patterning by means of photolithography and etching, and the like. It is to be noted that ALD (Atomic Layer Deposition), in particular, may be used to form a film. It is possible to use the ALD suitably in forming the switching transistor 100 according to the present embodiment because the ALD allows a favorable interface to be obtained on an insulating film or a semiconductor.

4. MODIFICATION EXAMPLES

4.1. Modification Example of Substrate

Subsequently, description is given of a modification example of a substrate of the switching transistor 100 according to the present embodiment, with reference to FIGS. 8A, 8B, and 8C. FIGS. 8A, 8B, and 8C are each a schematic cross-sectional diagram illustrating an example of the substrate to be used in the switching transistor 100 according to the present embodiment.

As illustrated in FIG. 8A, the switching transistor 100 may be formed by means of a substrate where the support substrate 130, the channel layer 131, the spacer layer 133, and the barrier layer 135 are stacked in sequence. It is to be noted that configurations of these are as described above, and thus description thereof is omitted here.

It is possible to form the switching transistor 100 by means of the substrate illustrated in FIG. 8A, as described below. Specifically, first, after films of the ohmic metal layer 121 and the insulation layer 117 are formed on the substrate illustrated in FIG. 8A, openings are provided in the insulation layer 117 of the region corresponding to the gate electrode 110 and the source or drain electrode 120. Thereafter, the gate insulating film 111 is formed on the insulation layer 117, and the gate electrode 110 and the source or drain electrode 120 are formed on the respective openings provided on the insulation layer 117. This allows for formation of the switching transistor 100.

The substrate illustrated in FIG. 8A allows for reduction in a substrate cost, thus making it possible to reduce a manufacturing cost of the switching transistor 100.

In addition, as illustrated in FIG. 8B, the switching transistor 100 may be formed by means of a substrate where the support substrate 130, the channel layer 131, the spacer layer 133, the barrier layer 135, and the protection layer 137 are stacked in sequence. It is to be noted that the configurations of these are as described above, and thus description thereof is omitted here.

It is possible to form the switching transistor 100 by means of the substrate illustrated in FIG. 8B, as described below. Specifically, first, the protection layer 137 of the region corresponding to the gate electrode 110 and the source or drain electrode 120 is removed by etching. Next, after the films of the ohmic metal layer 121 and the insulation layer 117 are formed on the substrate illustrated in FIG. 8B, openings are provided on the insulation layer 117 of the region corresponding to the gate electrode 110 and the source or drain electrode 120. Thereafter, the gate insulating film 111 is formed on the insulation layer 117, and the gate electrode 110 and the source or drain electrode 120 are formed on the respective openings provided on the insulation layer 117. This allows for the formation of the switching transistor 100.

The substrate illustrated in FIG. 8B allows for protection of the barrier layer 135 by the protection layer 137. Therefore, it is possible to suppress degradation of the characteristic of the barrier layer 135 due to entry of the impurity such as ion and resulting degradation of the characteristics of the switching transistor 100.

Furthermore, as illustrated in FIG. 8C, the switching transistor 100 may be formed by means of a substrate where the support substrate 130, the channel layer 131, the spacer layer 133, and the barrier layer 135 are stacked in sequence and a back-barrier layer 139 is inserted into an inside of the channel layer 131.

The back-barrier layer 139 includes a compound semiconductor material, and is provided to be inserted into the barrier layer 135 side inside the channel layer 131. Specifically, the back-barrier layer 139 includes the compound semiconductor material that is similar to the barrier layer 135. For example, in a case where the barrier layer 135 includes $Al_{1-x-y}Ga_xIn_yN$ (where $0<x<1$, $0<y<1$, $0<x+y<1$), the back-barrier layer 139 may similarly include $Al_{1-x-y}Ga_xIn_yN$ (where $0<x<1$, $0<y<1$, $0<x+y<1$). It is to be noted that other configurations are as described above, and thus description thereof is omitted here.

It is possible to form the switching transistor 100 by means of the substrate illustrated in FIG. 8C, as described below. Specifically, first, after the films of the ohmic metal layer 121 and the insulation layer 117 are formed on the substrate illustrated in FIG. 8C, openings are provided on the insulation layer 117 of the region corresponding to the gate electrode 110 and the source or drain electrode 120. Thereafter, the gate insulating film 111 is formed on the insulation layer 117, and the gate electrode 110 and the source or drain electrode 120 are formed on the respective openings provided on the insulation layer 117. This allows for the formation of the switching transistor 100.

According to the substrate illustrated in FIG. 8C, provision of the back-barrier layer 139 makes it possible to suppress a short-gate effect.

4.2. Modification Example of Gate Structure

Next, description is given of a modification example of a gate structure of the switching transistor 100 according to the present embodiment, with reference to FIGS. 9A, 9B, and 9C. FIGS. 9A, 9B, and 9C are each a schematic cross-sectional diagram illustrating an example of the gate structure to be used in the switching transistor according to the present embodiment.

As illustrated in FIG. 9A, the gate structure of a switching transistor 100A may be the MIS gate structure in which the gate electrode 110 is provided on the barrier layer 135 via an oxide film or nitride film 111A. The oxide film or nitride film 111A functions as a gate insulating film. As described above, the oxide film or nitride film 111A may be, for example, the oxide film including $SiO_2$, $Al_2O_3$, $HfO_2$, BeO, or the like or the nitride film including SiN, $Si_2N_3$, AlN, BN, or the like.

In addition, as illustrated in FIG. 9B, a gate structure of a switching transistor 100B may be the MIS gate structure in which the gate electrode 110 is provided on the barrier layer 135 via a first gate insulating film 112B and a second gate insulating film 113B. That is, in the switching transistor 100B, the gate insulating film may include the laminated film.

The first gate insulating film 112B and the second gate insulating film 113B may be, for example, the oxide film including $SiO_2$, $Al_2O_3$, $HfO_2$, BeO, or the like or the nitride film including SiN, $Si_2N_3$, AlN, BN, or the like which are described above as the material of the oxide film or nitride film 111A illustrated in FIG. 9A. In the switching transistor 100B illustrated in FIG. 9B, the gate insulating film may include the laminated film in which two or more types of the oxide films or the nitride films are stacked.

Furthermore, as illustrated in FIG. 9C, the gate structure of a switching transistor 100C may be the MIS gate structure in which the gate electrode 110 is provided on the barrier layer 135 via an intermediate layer 114C and a gate insulating film 111C. The intermediate layer 114C is provided between the barrier layer 135 and the gate insulating film 111C to improve an interface characteristic of the MIS gate structure. The intermediate layer 114C may include Si or Ge, for example, and may include other insulating material or non-insulating material as far as it improves the interface characteristic of the MIS gate structure.

4.3. Modification Example of Contact Structure

Subsequently, description is given of a modification example of a contact of the switching transistor 100 according to the present embodiment, with reference to FIGS. 10A, 10B, and 10C. FIGS. 10A, 10B, and 10C are each a schematic cross-sectional diagram illustrating an example of a contact structure to be used in the switching transistor according to the present embodiment.

As illustrated in FIG. 10A, in a switching transistor 101A, doping regions 122 are provided in the barrier layer 135 under the ohmic metal layers 121. Specifically, the doping region 122 is provided by doping, with a conductive impurity to high density, the region of the barrier layer 135 under each ohmic metal layer 121 that is provided under the source or drain electrode 120. For example, by performing donor ion implantation and annealing, the doping region 122 may be formed as an n-type region having the high density, in a partial region of the barrier layer 135. After this, by the ohmic metal layer 121 being formed on the doping region 122 of the barrier layer 135, it is possible to form the switching transistor 101A.

In the contact structure illustrated in FIG. 10A, provision of the doping region 122 with improved electric conductivity in the barrier layer 135 under the ohmic metal layer 121 makes it possible to further reduce the contact resistance between the ohmic metal layer 121 and the barrier layer 135.

In addition, as illustrated in FIG. 10B, in a switching transistor 101B, the barrier layer 135 under the source or drain electrodes 120 is removed, and ohmic metal layers 121B are provided to be in direct contact with the channel layer 131. Specifically, the barrier layer 135 and the spacer layer 133 of the region corresponding to the source or drain electrode 120 have been removed by the etching, and an opening that exposes the channel layer 131 is formed on the barrier layer 135. Provided inside the opening of the barrier layer 135, the ohmic metal layer 121B is provided in direct contact with the channel layer 131.

In the contact structure illustrated in FIG. 10B, the ohmic metal layer 121 is provided to be in direct contact with the channel layer 131 in which the two-dimensional electron gas, which is the channel, is formed. Therefore, it is possible to further reduce the on-resistance of the switching transistor 101B.

Furthermore, as illustrated in FIG. 10C, in a switching transistor 101C, ohmic regrowth layers 123 are provided under the ohmic metal layers 121. The ohmic regrowth layer 123 penetrates through the barrier layer 135 to contact the channel layer 131. The ohmic regrowth layer 123 is provided by causing a compound semiconductor, which is doped to the high density with the conductivity type impurity, to regrow on the channel layer 131.

Specifically, the barrier layer 135 and the spacer layer 133 of the region corresponding to the source or drain electrode 120 is removed by the etching and an opening that exposes the channel layer 131 is formed on the barrier layer 135. The ohmic regrowth layer 123 is formed on the opening of the barrier layer 135, by causing GaInN or GaN, which is doped with the n-type having the high density, to regrow. Thereafter, by the ohmic metal layer 121 and the source or drain electrode 120 being formed on the ohmic regrowth layer 123, the switching transistor 101C is formed.

In the contact structure illustrated in FIG. 10C, it is possible for the source or drain electrode 120 to reduce the contact resistance with the channel layer 131 by intervention of the ohmic metal layer 121 and the ohmic regrowth layer 123. In addition, in the contact structure illustrated in FIG. 10C, it is possible to form the semiconductor hetero-junction on an interface between the ohmic regrowth layer 123 and the channel layer 131. Therefore, it is possible to increase an area of the two-dimensional electron gas formed in the channel layer 131, as compared to the contact structure illustrated in FIG. 10B. It is to be noted that of the contact structures illustrated in FIGS. 10A, 10B, and 10C, it is possible for the contact structure illustrated in FIG. 10C to achieve the most favorable ohmic characteristic.

5. CHARACTERISTICS OF SWITCHING TRANSISTOR

Subsequently, description is given of the characteristics of the switching transistor 100 according to the present embodiment, with reference to FIG. 11 to FIG. 13. FIG. 11 is a graph chart illustrating a DC (Direct Current) characteristic of the switching transistor 100 illustrated in FIG. 7.

First, description is given of a Transfer characteristic of the switching transistor 100 according to the present embodiment, with reference to FIG. 11. FIG. 11 is a graph chart illustrating the Transfer characteristic of the switching transistor 100 illustrated in FIG. 7.

As illustrated in FIG. 11, the switching transistor 100 according to the present embodiment exhibits a low off-current value and it is seen that a leak current is little. In addition, the switching transistor 100 exhibits a steep rising characteristic near a threshold voltage and it is seen that the switching transistor 100 has the favorable switching characteristic.

Next, description is given of a distortion characteristic of the switching transistor 100 according to the present embodiment, with reference to FIG. 12. FIG. 12 is a graph chart illustrating an evaluation result of a third-order harmonic distortion characteristic of the switching transistor 100 illustrated in FIG. 7.

In FIG. 12, the dashed lines represent estimated values from a simulation, and a filled circle is a plot of an actually measured value using a substrate having the sheet electron density Ns of $1.6 \times 10^{13}$ cm$^{-2}$. As illustrated in FIG. 12, the actually measured value is substantially consistent with a simulation result. Therefore, it is seen that the switching transistor 100 according to the present embodiment allows for reduction of the harmonic distortion.

Here, to achieve targeted third-order harmonic distortion equal to or lower than −90 dBm, it is seen that in a case where the sheet electron density Ns is $1.7 \times 10^{13}$ cm$^{-2}$, it is possible to achieve desired low harmonic distortion if the on-resistance $R_{on}$ is roughly equal to or lower than 0.4 Ω·mm. In addition, it is seen that in a case where the electron density Ns is $2.0 \times 10^{13}$ cm$^{-2}$, it is possible to achieve the desired low harmonic distortion if the on-resistance $R_{on}$ is equal to or lower than 0.7 Ω·mm.

Subsequently, description is given of ohmic resistance of the switching transistor 100 according to the present embodiment, with reference to FIG. 13. FIG. 13 is a graph chart illustrating a relation between the size of the ohmic regrowth layer 123 and the ohmic characteristic of the switching transistor 101C illustrated in FIG. 10C.

As illustrated in FIG. 13, it is seen that adoption of the contact structure of the switching transistor 101C illustrated in FIG. 10C makes it possible to lower the ohmic resistance extremely. For example, to achieve the above-described third-order harmonic distortion equal to or lower than −90 dBm, it is requested that the sheet electron density Ns be $1.7 \times 10^{13}$ cm$^{-2}$, that the on-resistance $R_{on}$ be equal to or lower than 0.4 Ω·mm, and that the ohmic resistance be equal to or lower than 0.1 Ω·mm. With reference to FIG. 13, it is seen that the adoption of the contact structure illustrated in FIG. 10C makes it possible to achieve the ohmic resistance that is equal to or lower than 0.1 Ω·mm.

However, the size of the ohmic regrowth layer 123 is also a parameter that contributes to the shunt transistor characteristic. As the size of the ohmic regrowth layer 123 becomes smaller, the shunt transistor characteristic improves. In contrast, as the size of the ohmic regrowth layer 123 becomes smaller, the ohmic resistance increases. Therefore, conditions for forming the ohmic regrowth layer 123 that satisfies both of the shunt transistor characteristic and the ohmic resistance are requested. With reference to the result of FIG. 13, it is seen that the ohmic regrowth layer 123, if it is subjected to the n-type doping with the density equal to or higher than $3 \times 10^{20}$ cm$^{-3}$ and has the size equal to or larger than 3 μm, makes it possible to achieve the above-described desired characteristics.

6. APPLICATION EXAMPLE

Next, description is given of a semiconductor module to which the switching transistor 100 according to the present embodiment is applied, with reference to FIG. 14. FIG. 14 is a schematic perspective view explaining the semiconductor module to which the switching transistor 100 according to the present embodiment is applied.

As illustrated in FIG. 14, a semiconductor module 1 includes, for example, an edge antenna 20, a driver 31, a phase adjustment circuit 32, a switch 10, a low-noise amplifier 41, a bandpass filter 42, and a power amplifier 43.

The semiconductor module 1 is an antenna-integrated-module in which the array-like formed edge antenna 20, and front-end components such as the switch 10, the low-noise amplifier 41, the bandpass filter 42, and the power amplifier 43 are integrally mounted as one module. Such a semiconductor module 1 may be used as a communication transceiver, for example.

The switching transistor 100 according to the present embodiment may be applied to the switch 10, for example. Use of the switching transistor 100 according to the present embodiment makes it possible to implement the switch 10 for the high frequency application that achieves the low loss and the low distortion requested as the communication transceiver.

Although detailed description has been given above of the preferred embodiment of the present disclosure with reference to the accompanying drawings, the technical scope of the present disclosure is not limited to such examples. It is obvious that those having ordinary skill in the art of the present disclosure could conceive various modifications and alterations insofar as they are within the scope of the technical idea of the appended claims. It should also be understood that these variations and alterations naturally belong to the technical scope of the present disclosure.

In addition, the effects described herein are merely illustrative or exemplary, and not limiting. That is, together with the above-described effects or in place of the above-described effects, the technology according to the present disclosure may have effects that are obvious to those skilled in the art from the description in the present specification.

It should be noted that the following configurations also belong to the technical scope of the present disclosure.

(1)

A switching transistor including:

a channel layer including a compound semiconductor and having sheet electron density that is equal to or higher than $1.7 \times 10^{13}$ cm$^{-2}$;

a barrier layer formed on the channel layer by using a compound semiconductor that is of a different type from the channel layer;

a gate electrode provided on the barrier layer; and a source electrode and a drain electrode provided on the barrier layer with the gate electrode interposed between the source electrode and the drain electrode.

(2)

The switching transistor according to (1), in which the gate electrode is provided on the barrier layer via a gate insulating film.

(3)

The switching transistor according to (2), in which the gate insulating film includes a film including an oxide or a nitride.

(4)

The switching transistor according to any one of (1) to (3), in which at least a portion of the barrier layer includes $Al_xGa_yIn_{1-x-y}N$ (where $0<x<1$, $0<y<1$, $0<x+y<1$), and at least a portion of the channel layer includes GaN.

(5)

The switching transistor according to (4), in which a spacer layer is further provided on an interface between the channel layer and the barrier layer.

(6)

The switching transistor according to (5), in which the spacer layer includes AlN.

(7)

The switching transistor according to any one of (1) to (6), in which the source electrode and the drain electrode are provided on the barrier layer via an ohmic metal layer.

(8)

The switching transistor according to (7), in which a regrowth layer is further provided under the ohmic metal layer, the regrowth layer including a compound semiconductor containing a conductivity type impurity, and the regrowth layer is provided to penetrate through the barrier layer to be in contact with the channel layer.

(9)

The switching transistor according to (8), in which the regrowth layer is provided in a planar shape having a minimum width that is equal to or larger than 3 μm, and an amount of the conductivity type impurity contained by the regrowth layer is equal to or larger than $3\times10^{20}$ $cm^{-3}$.

(10)

The switching transistor according to (7), in which the ohmic metal layer is provided to penetrate through the barrier layer to be in contact with the channel layer.

(11)

The switching transistor according to (7), in which a doping region including a conductivity type impurity is formed in the barrier layer under the ohmic metal layer.

(12)

The switching transistor according to any one of (1) to (11), in which the barrier layer is provided on a silicon substrate.

(13)

A semiconductor module including:

a substrate;

various types of amplifiers provided on the substrate; and a switching transistor provided on the substrate and coupled to the various types of amplifiers, in which the switching transistor includes a channel layer including a compound semiconductor and having sheet electron density that is equal to or higher than $1.7\times10^{13}$ $cm^{-2}$, a barrier layer formed on the channel layer by using a compound semiconductor that is of a different type from the channel layer, a gate electrode provided on the barrier layer, and a source electrode and a drain electrode provided on the barrier layer with the gate electrode interposed between the source electrode and the drain electrode.

REFERENCE SIGNS LIST

1 Semiconductor module
10 Switch
20 Edge antenna
31 Driver
32 Phase adjustment circuit
41 Low-noise amplifier
42 Bandpass filter
43 Power amplifier
100 Switching transistor
110 Gate electrode
111 Gate insulating film
117 Insulation layer
120 Source or drain electrode
121 Ohmic metal layer
130 Support substrate
131 Channel layer
133 Spacer layer
135 Barrier layer
137 Protection layer

The invention claimed is:

1. A switching transistor, comprising:
a channel layer including a compound semiconductor and having sheet electron density that is equal to or higher than $1.7\times10^{13}$ $cm^{-2}$;
a barrier layer on the channel layer, wherein the barrier layer includes a compound semiconductor that is of a different type from the channel layer;
a back-barrier layer inside the channel layer, wherein the back-barrier layer includes a compound semiconductor similar to the barrier layer;
a gate electrode on the barrier layer;
a source electrode and a drain electrode on the barrier layer, wherein the gate electrode is between the source electrode and the drain electrode;
an insulation layer on the barrier layer, wherein the insulation layer includes an opening that corresponds to a region of the gate electrode;
an intermediate layer on the insulation layer; and
a gate insulating film on the intermediate layer, wherein
the intermediate layer is between the gate insulating film and the insulation layer,
the gate insulating film and the intermediate layer are inside the opening, and
the gate electrode contacts the barrier layer through the gate insulating film and the intermediate layer.

2. The switching transistor according to claim 1, wherein the gate insulating film includes an oxide or a nitride.

3. The switching transistor according to claim 1, wherein at least a portion of the barrier layer includes $Al_xGa_yIn_{1-x-y}N$, where $0<x<1$, $0<y<1$, $0<x+y<1$, and at least a portion of the channel layer includes GaN.

4. The switching transistor according to claim 3, further comprising a spacer layer on an interface between the channel layer and the barrier layer.

5. The switching transistor according to claim 4, wherein the spacer layer includes AlN.

6. The switching transistor according to claim 1, wherein the source electrode and the drain electrode are on the barrier layer via an ohmic metal layer.

7. The switching transistor according to claim 6, further comprising a regrowth layer under the ohmic metal layer, wherein
the regrowth layer includes a compound semiconductor containing a conductivity type impurity, and the regrowth layer penetrates through the barrier layer to be in contact with the channel layer.

8. The switching transistor according to claim 7, wherein the regrowth layer is in a planar shape having a minimum width that is equal to or larger than 3 µm, and an amount of the conductivity type impurity contained by the regrowth layer is equal to or larger than $3 \times 10^{20}$ cm$^{-3}$.

9. The switching transistor according to claim 6, wherein the ohmic metal layer penetrates through the barrier layer to be in contact with the channel layer.

10. The switching transistor according to claim 6, further comprising a doping region including a conductivity type impurity in the barrier layer, wherein the doping region is under the ohmic metal layer.

11. The switching transistor according to claim 1, wherein the barrier layer is on a silicon substrate.

12. A semiconductor module, comprising:
a substrate;
a plurality of types of amplifiers on the substrate; and
a switching transistor on the substrate and coupled to the plurality of types of amplifiers, wherein the switching transistor includes:
  a channel layer including a compound semiconductor and having sheet electron density that is equal to or higher than $1.7 \times 10^{13}$ cm$^{-2}$;
  a barrier layer on the channel layer, wherein the barrier layer includes a compound semiconductor that is of a different type from the channel layer;
  a back-barrier layer inside the channel layer, wherein the back-barrier layer includes a compound semiconductor similar to the barrier layer;
  a gate electrode on the barrier layer;
  a source electrode and a drain electrode on the barrier layer, wherein the gate electrode is between the source electrode and the drain electrode;
  an insulation layer on the barrier layer, wherein the insulation layer includes an opening that corresponds to a region of the gate electrode;
  an intermediate layer on the insulation layer; and
  a gate insulating film on the intermediate layer, wherein
    the intermediate layer is between the gate insulating film and the insulation layer,
    the gate insulating film and the intermediate layer are inside the opening, and
    the gate electrode contacts the barrier layer through the gate insulating film and the intermediate layer.

13. A switching transistor, comprising:
a channel layer including a compound semiconductor and having sheet electron density that is equal to or higher than $1.7 \times 10^{13}$ cm$^{-2}$;
a barrier layer on the channel layer, wherein the barrier layer includes a compound semiconductor that is of a different type from the channel layer;
a back-barrier layer inside the channel layer, wherein the back-barrier layer includes a compound semiconductor similar to the barrier layer;
a gate electrode on the barrier layer;
a source electrode and a drain electrode on the barrier layer, wherein the gate electrode is between the source electrode and the drain electrode;
an insulation layer on the barrier layer, wherein the insulation layer includes an opening that corresponds to a region of the gate electrode; and
a gate insulating film on the insulation layer, wherein
  the gate insulating film is inside the opening, and
  the gate electrode contacts the barrier layer through the gate insulating film.

* * * * *